(12) United States Patent
Tanaka

(10) Patent No.: US 9,349,849 B2
(45) Date of Patent: May 24, 2016

(54) SEMICONDUCTOR DEVICE AND ELECTRONIC DEVICE INCLUDING THE SEMICONDUCTOR DEVICE

(71) Applicant: Semiconductor Energy Laboratory Co., Ltd., Atsugi-shi, Kanagawa-ken (JP)

(72) Inventor: Tetsuhiro Tanaka, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 58 days.

(21) Appl. No.: 13/833,342

(22) Filed: Mar. 15, 2013

(65) Prior Publication Data

US 2013/0299818 A1 Nov. 14, 2013

(30) Foreign Application Priority Data

Mar. 28, 2012 (JP) .................................. 2012-073827

(51) Int. Cl.
*H01L 29/78* (2006.01)
*H01L 21/16* (2006.01)
*H01L 29/786* (2006.01)
*H01L 27/12* (2006.01)

(52) U.S. Cl.
CPC ............ *H01L 29/78* (2013.01); *H01L 27/1225* (2013.01); *H01L 29/7869* (2013.01)

(58) Field of Classification Search
CPC ..... H01L 29/7869; H01L 21/16; H01L 29/00; H01L 21/00; H01L 29/24; H01L 21/479
USPC .......................................................... 257/43
See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Nakamura.Y et al., "Oxidation-Resistant Amorphous TaN Barrier for MIM-Ta2O5 Capacitors in Giga-Bit DRAMs", 2001 Symposium on VLSI Technology Digest of Technical Papers, 2001, pp. 39-40.

(Continued)

*Primary Examiner* — Allen Parker
*Assistant Examiner* — Didarul Mazumder
(74) *Attorney, Agent, or Firm* — Robinson Intellectual Property Law Office; Eric J. Robinson

(57) ABSTRACT

In a semiconductor device including a transistor, an oxygen release type oxide insulating film is formed in contact with a channel formation region of the transistor. The channel formation region is formed in an oxide semiconductor film. Oxygen is supplied from the oxide insulating film to the oxide semiconductor film. Further, an oxygen bather film which penetrates the oxide insulating film is formed around the channel formation region, whereby a diffusion of oxygen to the wiring, the electrode, and the like connected to the transistor can be suppressed.

20 Claims, 16 Drawing Sheets

(56) References Cited

U.S. PATENT DOCUMENTS

| | | | |
|---|---|---|---|
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,207,756 B2* | 6/2012 | Shionoiri et al. | 326/98 |
| 8,809,992 B2 | 8/2014 | Yamazaki et al. | |
| 8,865,555 B2 | 10/2014 | Yamazaki et al. | |
| 9,012,905 B2 | 4/2015 | Yamazaki | |
| 9,093,538 B2 | 7/2015 | Yamazaki | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0114616 A1* | 5/2007 | Manger et al. | 257/407 |
| 2007/0152217 A1 | 7/2007 | Lai et al. | |
| 2007/0155157 A1* | 7/2007 | Chou et al. | 438/618 |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0001254 A1* | 1/2008 | Wang | 257/532 |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0299702 A1* | 12/2008 | Son et al. | 438/104 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0059817 A1* | 3/2010 | Pham et al. | 257/336 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0101351 A1* | 5/2011 | Yamazaki | 257/57 |
| 2011/0147737 A1* | 6/2011 | Yamazaki et al. | 257/43 |
| 2011/0175087 A1 | 7/2011 | Yamazaki et al. | |
| 2011/0215317 A1* | 9/2011 | Yamazaki et al. | 257/43 |
| 2012/0187396 A1* | 7/2012 | Yamazaki et al. | 257/43 |
| 2012/0256177 A1* | 10/2012 | Yamazaki | 257/43 |
| 2015/0008430 A1 | 1/2015 | Yamazaki et al. | |
| 2015/0037932 A1 | 2/2015 | Yamazaki et al. | |
| 2015/0221776 A1 | 8/2015 | Yamazaki | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289810 | 10/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-241690 | 8/2004 |
| JP | 2004-273614 A | 9/2004 |
| JP | 2004-273732 A | 9/2004 |
| JP | 2004-335643 | 11/2004 |
| JP | 2007-096055 | 4/2007 |
| JP | 2007-123861 | 5/2007 |
| WO | WO-2004/114391 | 12/2004 |
| WO | WO2005/038883 | 4/2005 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCUPS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 L SID International Symposium Digest of Technical Papers, 2004, vol. 35, pp. 860-863.

(56) References Cited

OTHER PUBLICATIONS

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IgZo Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350° C,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. at al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K at al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J at al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H at al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 Inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase", ", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 209, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTs,", IDW'09 :Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTs With a Novel Passivation Layer,", SID Digest '09 : SID International Syposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,",

(56) References Cited

OTHER PUBLICATIONS

SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM NEWSLETTER, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3-A2O3-Bo Systems [A; Fe, Ga, Or Al; B: Mg, Mn, Fe, Ni, Cu,Or Zn] at Temperatures over 1000° C,", Journal of Solid State Chemistry, 1985, vol. 60, pp. 382-384.

Kitzerow.H at al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposiumdigest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Apl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A at al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of Zno Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

FIG. 3A
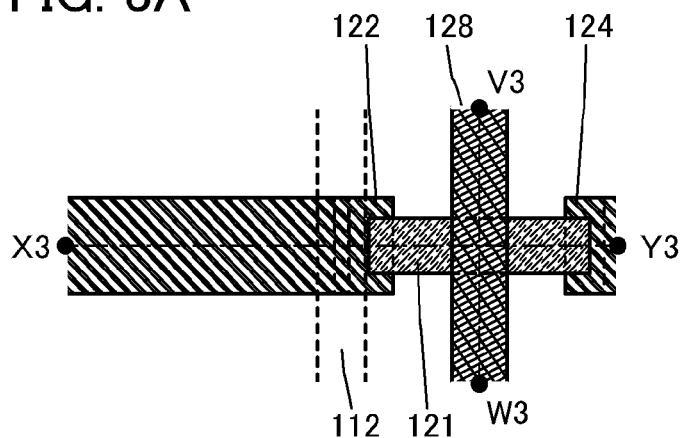
FIG. 3B
FIG. 3C
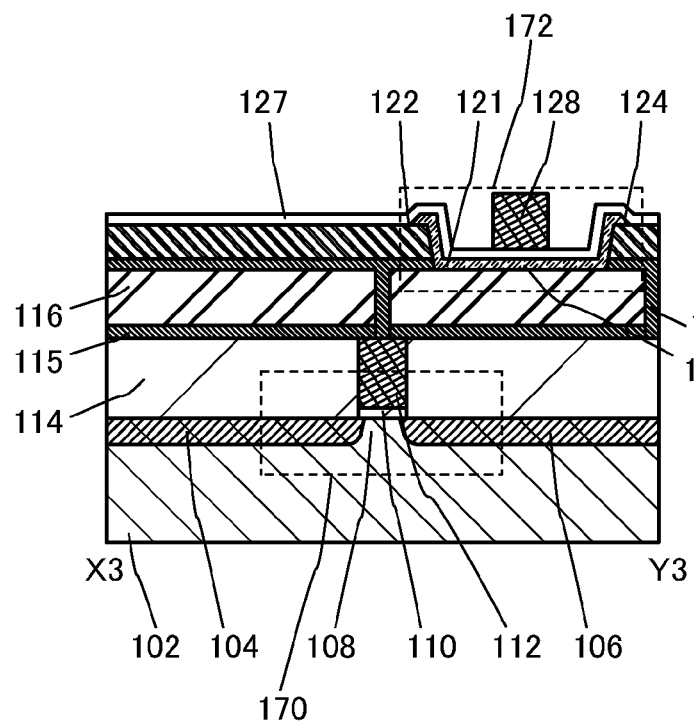
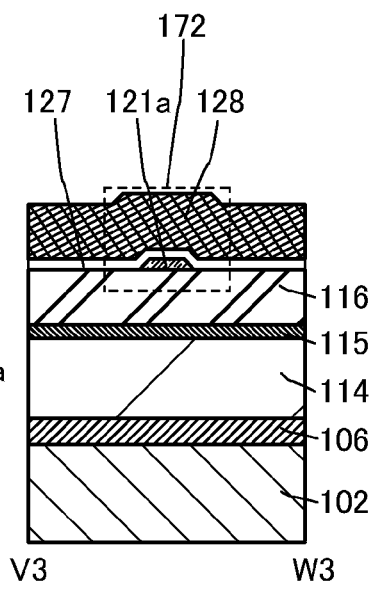

SEMICONDUCTOR DEVICE AND ELECTRONIC DEVICE INCLUDING THE SEMICONDUCTOR DEVICE

BACKGROUND OF THE INVENTION

1. Field of the Invention

An embodiment of the present invention relates to a semiconductor device including a transistor or a semiconductor device including a circuit which is formed by using a transistor. For example, an embodiment of the present invention relates to a semiconductor device including a transistor in which a channel formation region is formed using an oxide semiconductor or a semiconductor device including a circuit which is formed by using such a transistor. Further, the present invention relates to an electronic device which includes, as a component, an LSI, a CPU, a power device mounted in a power circuit, a semiconductor integrated circuit including a memory, a thyristor, a converter, an image sensor, or the like, an electro-optical device typified by a liquid crystal display panel, or a light-emitting display device including a light-emitting element.

In this specification, a semiconductor device means all types of devices that can function by utilizing semiconductor characteristics, and an electro-optical device and a semiconductor circuit are both semiconductor devices.

2. Description of the Related Art

In recent years, semiconductor devices have been developed to be used as an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, or a memory is mounted on a circuit board, for example, a printed wiring board, to be used as one of components of a variety of electronic devices.

Further, a technique for using an oxide semiconductor for a channel formation region in a transistor has been attracting attention. Examples of such a transistor include a transistor in which zinc oxide (ZnO) is used as an oxide semiconductor and a transistor in which $InGaO_3(ZnO)_m$ is used as an oxide semiconductor. A technique for manufacturing such a transistor including an oxide semiconductor over a light-transmitting substrate and applying it to a switching element or the like of an image display device is disclosed in Patent Documents 1 and 2.

REFERENCE

Patent Document

[Patent Document 1] Japanese Published Patent Application No. 2007-123861
[Patent Document 2] Japanese Published Patent Application No. 2007-096055

SUMMARY OF THE INVENTION

For an LSI, a CPU, or a memory, a multi-layer structure (hereinafter, a stacked semiconductor device) in which components such as a transistor, a memory, and capacitor are stacked for integration of a semiconductor element is used, whereby storage capacity per unit area is increased. Further, for example, in the case where an n-channel transistor is used as the transistor, it is preferable that a channel be formed with positive gate voltage which is as close to 0 V as possible. If the threshold voltage of the transistor is negative, the transistor tends to be in a so-called normally-on state, in which current flows between the source electrode and the drain electrode even when the gate voltage is 0 V.

For an LSI, a CPU or a memory, electric characteristics of transistors included in a circuit are significant and the electric characteristics affect power consumption of the semiconductor device. In particular, threshold voltage, which is one of the electric characteristics of transistors, is important. When the threshold voltage is negative even when field effect mobility is high, it is difficult to control the circuit. Such a transistor in which a channel is formed even at negative voltage so that drain current flows is not suitable as a transistor used in an integrated circuit of a semiconductor device.

Further, there is a problem that, in a transistor using an oxide semiconductor for a channel formation region, when oxygen vacancies exist in the oxide semiconductor film, the threshold voltage shifts in the negative direction. Therefore, there is a method for supplying oxygen from a film in contact with an oxide semiconductor film in order to fill oxygen vacancies in the oxide semiconductor film.

However, there is a problem that, in the stacked semiconductor device, when the oxygen is supplied, the oxygen is also diffused to a portion other than the oxide semiconductor film and the oxygen cannot be efficiently supplied to the oxide semiconductor film. Further, when oxygen diffused to a portion other than the oxide semiconductor film is supplied to, for example, a metal material such as a source electrode, a drain electrode, and a connection electrode, the metal material is oxidized.

In view of the above problems, an object of one embodiment of the disclosed invention is to provide a transistor including an oxide semiconductor film with stable electric characteristics in which oxygen vacancies in the oxide semiconductor film are filled by supplying oxygen. Further, another object is to provide a highly reliable semiconductor device in which a diffusion of oxygen to a wiring, an electrode, and the like which are connected to the transistor is suppressed. In addition, another object is to provide an electronic device using the semiconductor device.

In order to solve the above problems, in the semiconductor device in one embodiment of the present invention, an oxide insulating film is formed in contact with a channel formation region and oxygen is supplied from the oxide insulating film to an oxide semiconductor film in a transistor including the channel formation region in the oxide semiconductor film. Further, an oxygen barrier film is formed at least around the channel formation region, whereby a diffusion of oxygen to the wiring, the electrode, and the like which are connected to the transistor can be suppressed. Details thereof will be described below.

One embodiment of the present invention is a semiconductor device including a first transistor including a first channel formation region formed using a first semiconductor material, a second transistor including a second channel formation region formed using a second semiconductor material, which is provided above the first transistor, and an oxide insulating film provided between the first transistor and the second transistor. The oxide insulating film is provided in contact with at least the second channel formation region. An oxygen barrier film penetrating through the oxide insulating film is provided around the second channel formation region.

Further, another embodiment of the present invention is a semiconductor device including a first transistor including a first channel formation region formed using a first semiconductor material, a first gate insulating film formed over the first channel formation region, a first gate electrode formed at a position in contact with the first gate insulating film and overlapping with the first channel formation region, and a source region and a drain region formed so as to sandwich the first channel formation region, a second transistor including a second channel formation region formed using a second semiconductor material, a second gate insulating film formed over the second channel formation region, a second gate electrode formed at a position in contact with the second gate insulating film and overlapping with the second channel formation region, and a source electrode and a drain electrode which are electrically connected to the second channel formation region, and an oxide insulating film provided between the first transistor and the second transistor. The oxide insulating film is provided in contact with at least the second channel formation region. An oxygen bather film penetrating through the oxide insulating film is provided around the second channel formation region.

An oxygen barrier film penetrating through an oxide insulating film is provided around the second channel formation region, whereby an electrode which connects the first transistor and the second transistor or the like can be formed in the region penetrated by the oxygen bather film. Further, the oxygen bather film formed so as to penetrate the oxide insulating film can suppress a diffusion of oxygen from the oxide insulating film in the horizontal direction to the second channel formation region of the oxide semiconductor film. Further, the oxygen barrier film formed so as to penetrate the oxide insulating film can suppress a diffusion of oxygen to an electrode connecting the first transistor and the second transistor or the like. Only the oxygen barrier film penetrating through the oxide insulating film has the above effects.

In each of the above structures, further, a capacitor provided on the same surface as the second transistor is preferably included. By forming the capacitor on the same surface as the second transistor, manufacturing cost can be reduced.

In each of the above structures, a connection electrode penetrating through the oxide insulating film and electrically connecting the first transistor and the second transistor is preferably included. Further, the connection electrode is preferably provided in contact with the oxygen barrier film. The connection electrode is provided in contact with the oxygen barrier film, whereby oxidation of the connection electrode can be suppressed.

In each of the above structures, the oxygen barrier film is preferably a metal film formed of metal selected from aluminum, ruthenium, iridium, hafnium, and tantalum, or a metal oxide film formed of oxide thereof, or a metal nitride film formed of nitride thereof.

In each of the above structures, the first semiconductor material is preferably a material including silicon. Further the second semiconductor material is preferably an oxide semiconductor film and the oxide semiconductor film preferably includes at least indium or zinc.

One embodiment of the present invention is an electronic device having any of the above structures.

In a transistor including an oxide semiconductor film, oxygen vacancies in the oxide semiconductor film are filled, whereby a transistor with stable electric characteristics can be provided. Further, a diffusion of oxygen to a wiring, an electrode, and the like which are connected to the transistor is suppressed, whereby a semiconductor device with high reliability can be provided. Further, an electronic device including the semiconductor device can be provided.

BRIEF DESCRIPTION OF THE DRAWINGS

In the accompanying drawings:
FIGS. 3A to 3C illustrate an embodiment of a semiconductor device.

DETAILED DESCRIPTION OF THE INVENTION

Figure 1A:
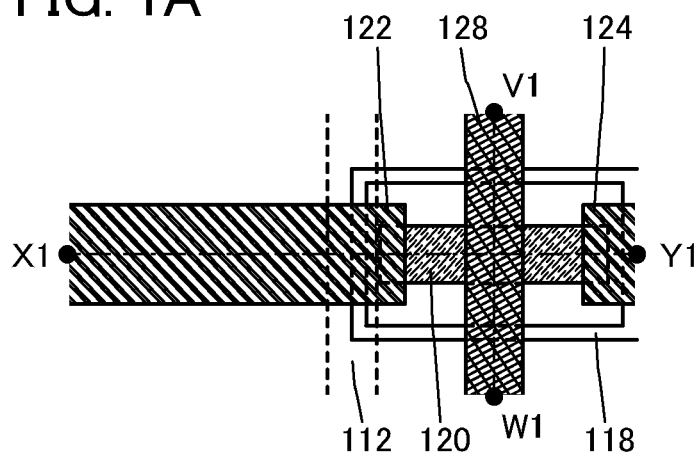
FIGS. 1A to 1C illustrate an embodiment of a semiconductor device.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Further, the present invention is not construed as being limited to description of the embodiments.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not limit the components numerically.

Note that in this specification and the like, the term such as "over" or "below" does not necessarily mean that a component is placed "directly on" or "directly under" another component. For example, the expression "a gate electrode over a gate insulating film" can mean the case where there is an additional component between the gate insulating film and the gate electrode.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be used to denote the drain and the source, respectively, in this specification.

Note that in this specification and the like, the term "electrically connected" includes the case where components are connected through an object having any electric function. There is no particular limitation on an object having any electric function as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

(Embodiment 1)

In this embodiment, one embodiment of a semiconductor device will be described with reference to FIGS. 1A to 1C, FIGS. 2A to 2C, FIGS. 3A to 3C, and FIGS. 4A to 4C. In this embodiment, as an example of the semiconductor device, a cross-sectional view of a stacked semiconductor device is shown.

Figure 1B:
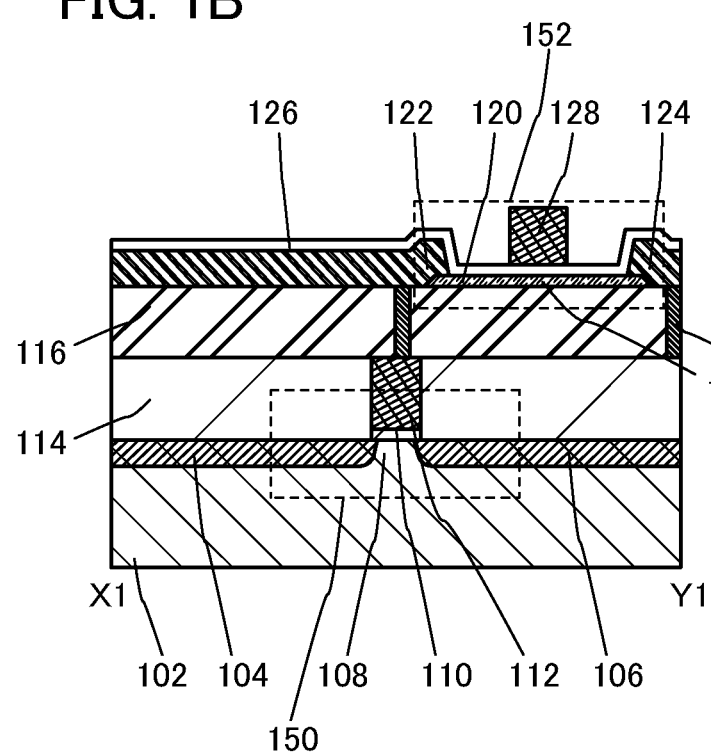
Figure 1C:
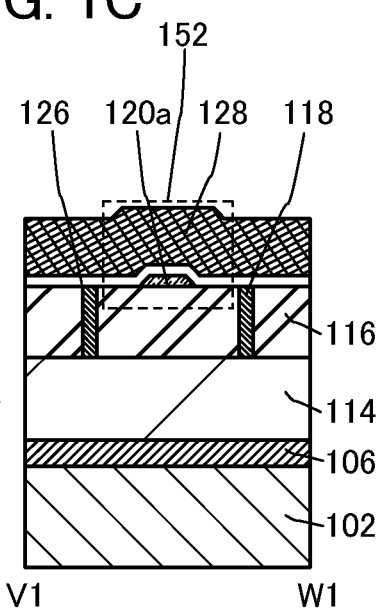

FIG. 1A is a plan view of the semiconductor device, FIG. 1B corresponds to a cross-sectional view taken along line X1-Y1 in FIG. 1A, and FIG. 1C corresponds to a cross-sectional view taken along line V1-W1 in FIG. 1A. Note that in FIG. 1A, some components of the semiconductor device (e.g., a second gate insulating film 126) are omitted for simplicity.

The semiconductor device illustrated in FIGS. 1A to 1C includes a first transistor 150 including a first channel formation region 108 formed using a first semiconductor material 102, a second transistor 152 including a second channel formation region 120a formed using a second semiconductor material, which is provided above the first transistor 150, and an oxide insulating film 116 provided between the first transistor 150 and the second transistor 152. The oxide insulating film 116 is provided in contact with at least the second channel formation region 120a. An oxygen barrier film 118 which penetrates through the oxide insulating film 116 is provided around the second channel formation region 120a. The first semiconductor material 102 is preferably a material including silicon, and for example, a silicon wafer or the like of single crystal silicon or polycrystalline silicon. For the second semiconductor material, an oxide semiconductor can be used, for example.

Further, the first transistor 150 includes a first gate insulating film 110 formed over the first channel formation region 108, a first gate electrode 112 formed at a position in contact with the first gate insulating film 110 and overlapping with the first channel formation region 108, a source region 104 and a drain region 106 which are formed so as to sandwich the first channel formation region 108. An interlayer insulating film 114 is formed over the first transistor 150 (specifically, over the source region 104 and the drain region 106).

Note that FIG. 1B illustrates an element in which distinct source and drain electrodes of the first transistor 150 are not provided; however, the element in such a state is sometimes referred to as a transistor for the sake of convenience. Further, in such a case, in description of connection of a transistor, a source region and a source electrode may be collectively referred to as a "source electrode," and a drain region and a drain electrode may be collectively referred to as a "drain electrode". That is, in this specification and the like, the term "source electrode" might include a source region and the term "drain electrode" might include a drain region.

Further, the second transistor 152 includes the second channel formation region 120a formed in an oxide semiconductor film 120, a second gate insulating film 126 formed over the second channel formation region 120a, a second gate electrode 128 formed at a position in contact with the second gate insulating film 126 and overlapping with the second channel formation region 120a, and a source electrode 122 and a drain electrode 124 which are electrically connected to the second channel formation region 120a.

Here, the first semiconductor material and the second semiconductor material are preferably materials having different band gaps. For example, the first semiconductor material can be a semiconductor material other than an oxide semiconductor (e.g., crystalline silicon) and the second semiconductor material can be an oxide semiconductor. A transistor including crystalline silicon or the like as the first semiconductor material can easily operate at high speed. On the other hand, a transistor including an oxide semiconductor as the second semiconductor material enables charge to be held for a long time owing to its characteristics.

As the oxide insulating film 116, an oxygen release type oxide insulating film which releases oxygen by heating is preferably used. To release oxygen by heating means that the amount of released oxygen which is converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS).

As the oxygen bather film 118, a film having low oxygen permeability is preferably used. As the oxygen barrier film 118, for example, a metal film formed of a metal selected from aluminum, ruthenium, iridium, hafnium, and tantalum, a metal oxide film formed of oxide thereof, or a nitride film formed of nitride thereof is preferably used. Further, a film including at least one of aluminum oxide, ruthenium, ruthenium oxide, iridium, iridium oxide, and tantalum nitride is more preferable. In the structure illustrated in FIGS. 1A to 1C, an aluminum oxide film is used as the oxygen bather film 118.

As illustrated in FIGS. 1A to 1C, by providing the oxygen barrier film 118, when the oxide insulating film 116 is heated, a diffusion of oxygen from the oxide insulating film 116 formed below the oxide semiconductor film 120 in the horizontal direction can be suppressed and oxygen can be preferably supplied to the oxide semiconductor film 120 (in particular, the second channel formation region 120a).

Note that an oxygen barrier film may be provided between the interlayer insulating film 114 and the oxide insulating film 116. With such a structure, the diffusion of oxygen which is released from the oxide insulating film 116 to the first transistor 150 side can be suppressed, and when the oxide insulating film 116 is heated, oxygen can be preferably supplied to the oxide semiconductor film 120 (in particular, the second channel formation region 120a).

Further, in FIGS. 1A to 1C, the oxygen bather film 118 penetrates through the oxide insulating film 116 surrounding the second channel formation region 120a; however, the structure is not limited thereto. For example, the oxygen barrier film 118 may penetrate through the oxide insulating film 116 only in a channel length direction (in the cross-sectional view direction illustrated in FIG. 1B) or the oxygen barrier film 118 may penetrate through the oxide insulating film 116 only in a channel width direction (in the cross-sectional view direction illustrated in FIG. 1C). Note that in the structure illustrated in FIGS. 1A to 1C, in the case of forming the oxygen barrier film 118 using a conductive material, the source electrode 122 and the drain electrode 124 have the same potential; therefore, in the case of the structure in FIGS. 1A to 1C, the insulating oxygen barrier film 118 is preferably used.

Next, an embodiment of a semiconductor device different from the semiconductor device illustrated in FIGS. 1A to 1C will be described with reference to FIGS. 2A to 2C. Note that in FIGS. 2A to 2C, the same reference numerals are used for the same parts as those in FIGS. 1A to 1C, and description of the parts with the same reference numerals is omitted.

Figure 2A:
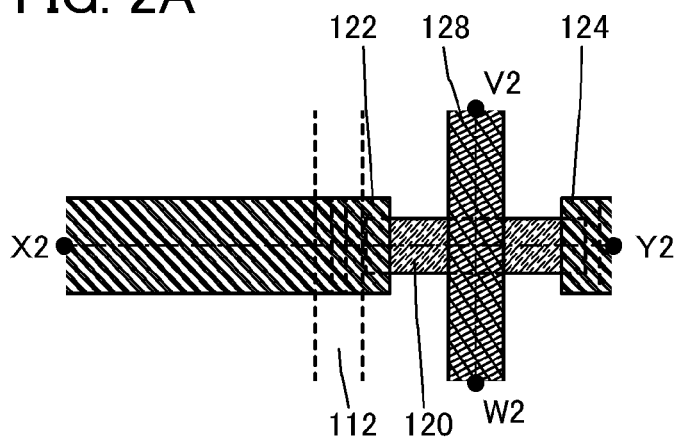
FIGS. 2A to 2C illustrate an embodiment of a semiconductor device.
Figure 2B:
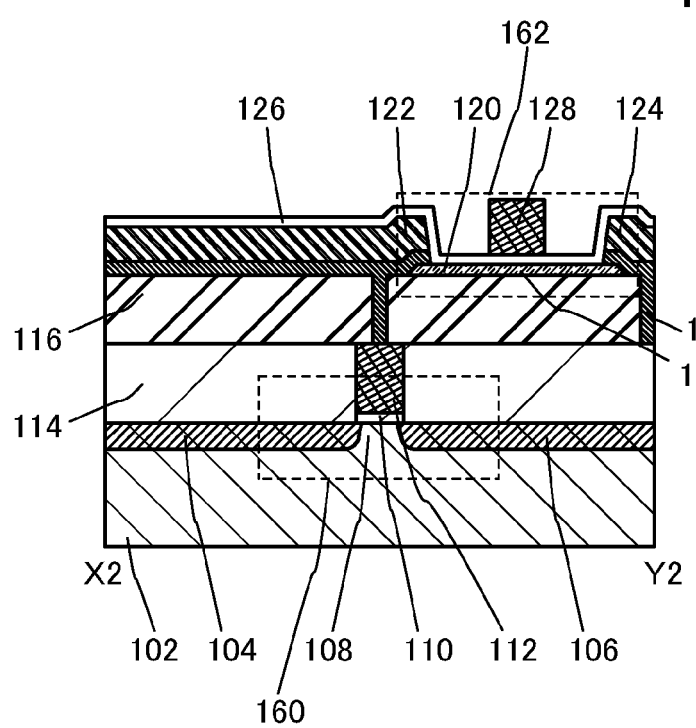
Figure 2C:
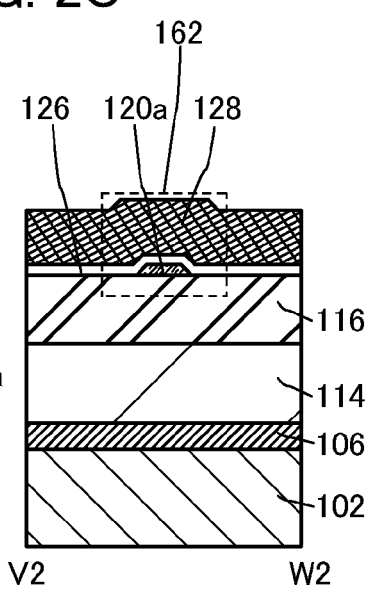

FIG. 2A is a plan view of the semiconductor device, FIG. 2B corresponds to a cross-sectional view taken along line X2-Y2 in FIG. 2A, and FIG. 2C corresponds to a cross-sectional view taken along line V2-W2 in FIG. 2A. Note that in FIG. 2A, some components of the semiconductor device (e.g., a second gate insulating film 126) are omitted for simplicity.

The semiconductor device illustrated in FIGS. 2A to 2C includes a first transistor 160 including a first channel formation region 108 formed using a first semiconductor material 102, a second transistor 162 including a second channel formation region 120a formed using a second semiconductor material, which is provided above the first transistor 160, and an oxide insulating film 116 provided between the first transistor 160 and the second transistor 162. The oxide insulating film 116 is provided in contact with at least the second channel formation region 120a. An oxygen barrier film 123 which penetrates through the oxide insulating film 116 is provided around the second channel formation region 120a.

Further, the first transistor 160 includes a first gate insulating film 110 formed over the first channel formation region 108, a first gate electrode 112 formed at a position in contact with the first gate insulating film 110 and overlapping with the first channel formation region 108, a source region 104 and a drain region 106 which are formed so as to sandwich the first channel formation region 108. An interlayer insulating film 114 is formed over the first transistor 160 (specifically, over the source region 104 and the drain region 106).

Further, the second transistor 162 includes the second channel formation region 120a formed in an oxide semiconductor film 120, a second gate insulating film 126 formed over the second channel formation region 120a, a second gate electrode 128 formed at a position in contact with the second gate insulating film 126 and overlapping with the second channel formation region 120a, and a source electrode 122 and a drain electrode 124 which are electrically connected to the second channel formation region 120a.

As the oxide insulating film 116, an oxygen release type oxide insulating film which releases oxygen by heating is preferably used.

As the oxygen barrier film 123, a film having low oxygen permeability is preferably used, for example, a metal film formed of metal selected from aluminum, ruthenium, iridium, hafnium, and tantalum, a metal oxide film formed of oxide thereof, or a metal nitride film formed of nitride thereof is preferably used. In the structure illustrated in FIGS. 2A to 2C, a ruthenium oxide film which is a conductive material is used as the oxygen barrier film 123.

Further, in the structure illustrated in FIGS. 2A to 2C, the oxygen barrier film 123 functions as part of the source electrode 122 and the drain electrode 124. With such a structure, the oxygen barrier film 123 can be used as part of a connection electrode between the first transistor 160 and the second transistor 162. Specifically, the oxygen barrier film 123 connects the first gate electrode 112 of the first transistor 160 to the source electrode 122 of the second transistor 162. In the case of using the oxygen barrier film as the connection electrode between the first transistor 160 and the second transistor 162, the oxygen barrier film is preferably formed using a conductive material.

As illustrated in FIGS. 2A to 2C, by providing the oxygen bather film 123, when the oxide insulating film 116 is heated, a diffusion of oxygen from the oxide insulating film 116 formed below the oxide semiconductor film 120 in the horizontal direction can be suppressed and oxygen can be preferably supplied to the oxide semiconductor film 120 (in particular, the second channel formation region 120a). Further, by providing the oxygen bather film 123 in a layer under the source electrode 122 and the drain electrode 124, oxygen which is released from the oxide insulating film 116 when the film is heated is not supplied to the source electrode 122 and the drain electrode 124. Therefore, oxidation of the source electrode 122 and the drain electrode 124 can be suppressed.

Note that the oxygen barrier film may be provided between the interlayer insulating film 114 and the oxide insulating film 116. With such a structure, the diffusion of oxygen which is released from the oxide insulating film 116 to the first transistor 160 side can be suppressed, and when the oxide insulating film 116 is heated, oxygen can be preferably supplied to the oxide semiconductor film 120 (in particular, the second channel formation region 120a).

Next, an embodiment of a semiconductor device different from the semiconductor devices illustrated in FIGS. 1A to 1C and FIGS. 2A to 2C will be described with reference to FIGS. 3A to 3C. Note that in FIGS. 3A to 3C, the same reference numerals are used for the same parts as those in FIGS. 1A to 1C and FIGS. 2A to 2C, and description of the parts with the same reference numerals is omitted.

FIG. 3A is a plan view of the semiconductor device, FIG. 3B corresponds to a cross-sectional view taken along line X3-Y3 in FIG. 3A, and FIG. 3C corresponds to a cross-sectional view taken along line V3-W3 in FIG. 3A. Note that in FIG. 3A, some components of the semiconductor device (e.g., a second gate insulating film 127) are omitted for simplicity.

The semiconductor device illustrated in FIGS. 3A to 3C includes a first transistor 170 including a first channel formation region 108 formed using a first semiconductor material 102, a second transistor 172 including a second channel formation region 121a formed using a second semiconductor material, which is provided above the first transistor 170, and an oxide insulating film 116 provided between the first transistor 170 and the second transistor 172. The oxide insulating film 116 is provided in contact with at least the second channel formation region 121a. An oxygen barrier film 123 which penetrates through the oxide insulating film 116 is provided around the second channel formation region 121a.

Further, the first transistor 170 includes a first gate insulating film 110 formed over the first channel formation region 108, a first gate electrode 112 formed at a position in contact with the first gate insulating film 110 and overlapping with the first channel formation region 108, a source region 104 and a drain region 106 which are formed so as to sandwich the first channel formation region 108. An interlayer insulating film 114 is formed over the first transistor 170 (specifically, over the source region 104 and the drain region 106).

Further, the second transistor 172 includes the second channel formation region 121a formed in an oxide semiconductor film 121, a second gate insulating film 127 formed over the second channel formation region 121a, a second gate electrode 128 formed at a position in contact with the second gate insulating film 127 and overlapping with the second channel formation region 121a, and a source electrode 122 and a drain electrode 124 which are electrically connected to the second channel formation region 121*a*.

As the oxide insulating film 116, an oxygen release type oxide insulating film which releases oxygen by heating is preferably used.

As the oxygen barrier film 123, a film having low oxygen permeability is preferably used, and in the structure illustrated in FIGS. 3A to 3C, a conductive material is used. As the oxygen barrier film 123, for example, a metal film formed of metal selected from aluminum, ruthenium, iridium, hafnium, and tantalum, a metal oxide film formed of oxide thereof, or a metal nitride film formed of nitride thereof is preferably used. In the structure illustrated in FIGS. 3A to 3C, a ruthenium oxide film is used as the oxygen barrier film 123.

Note that, in the structure illustrated in FIGS. 3A to 3C, the oxygen barrier film 123 functions as part of the source electrode 122 and the drain electrode 124. With such a structure, the oxygen barrier film 123 can be used as part of a connection electrode between the first transistor 170 and the second transistor 172. Specifically, the oxygen barrier film 123 connects the first gate electrode 112 of the first transistor 170 to the source electrode 122 of the second transistor 172.

As illustrated in FIGS. 3A to 3C, by providing the oxygen barrier film 123, when the oxide insulating film 116 is heated, a diffusion of oxygen from the oxide insulating film 116 formed below the oxide semiconductor film 121 in the horizontal direction can be suppressed and oxygen can be preferably supplied to the oxide semiconductor film 121 (in particular, the second channel formation region 121*a*). Further, by providing the oxygen barrier film 123 in a layer under the source electrode 122 and the drain electrode 124, oxygen which is released from the oxide insulating film 116 when the film is heated is not supplied to the source electrode 122 and the drain electrode 124. Therefore, oxidation of the source electrode 122 and the drain electrode 124 can be suppressed.

Further, the semiconductor device in FIGS. 3A to 3C is different from the semiconductor device in FIGS. 2A to 2C in that an oxygen barrier film 115 is provided between the interlayer insulating film 114 and the oxide insulating film 116. With such a structure, the diffusion of oxygen which is released from the oxide insulating film 116 to the first transistor 170 side can be suppressed, and when the oxide insulating film 116 is heated, oxygen can be preferably supplied to the oxide semiconductor film 121 (in particular, the second channel formation region 121*a*).

Furthermore, the semiconductor device in FIGS. 3A to 3C is different from the semiconductor device in FIGS. 2A to 2C in a connection position between the source electrode 122 and the oxide semiconductor film 121 and a connection position between the drain electrode 124 and the oxide semiconductor film 121 of the second transistor 172. In the semiconductor device in FIGS. 2A to 2C, the source electrode 122 and the drain electrode 124 are connected to an upper side of the oxide semiconductor film 120 (so called a top contact type) and in the semiconductor device in FIGS. 3A to 3C, the source electrode 122 and the drain electrode 124 are connected to a lower side of the oxide semiconductor film 121 (so called a bottom contact type). In this manner, the structure of the second transistor is not particularly limited, and a practitioner may select the most suitable structure as appropriate.

Next, an embodiment of a semiconductor device different from the semiconductor devices illustrated in FIGS. 1A to 1C, FIGS. 2A to 2C, and FIGS. 3A to 3C will be described with reference to FIGS. 4A to 4C. Note that in FIGS. 4A to 4C, the same reference numerals are used for the same parts as those in FIGS. 1A to 1C, FIGS. 2A to 2C, and FIGS. 3A to 3C, and description of the parts with the same reference numerals is omitted.

Figure 4A:
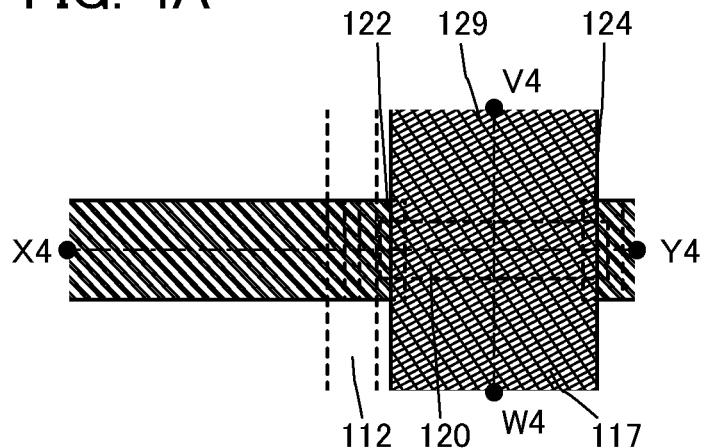
FIGS. 4A to 4C illustrate an embodiment of a semiconductor device.
Figure 4B:
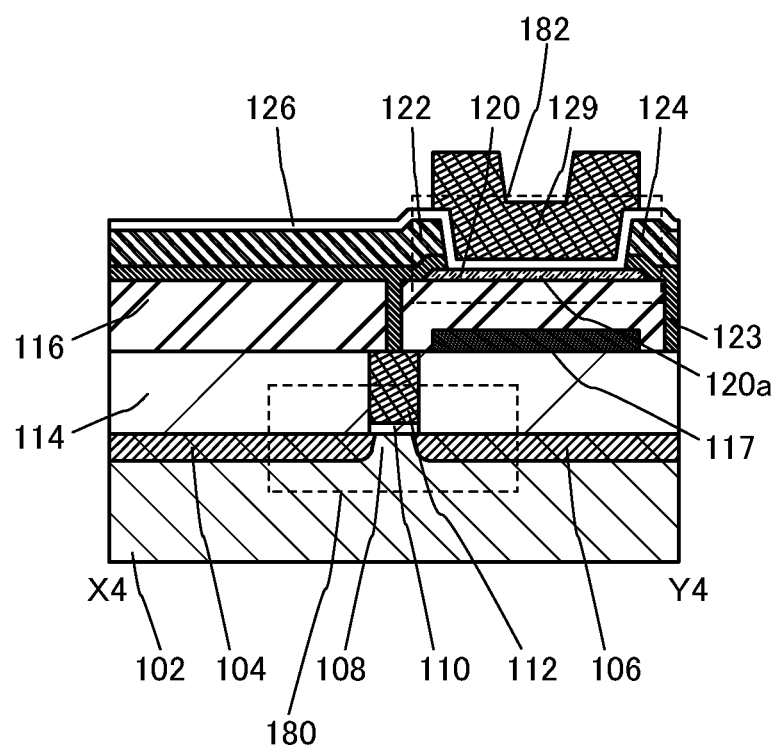
Figure 4C:
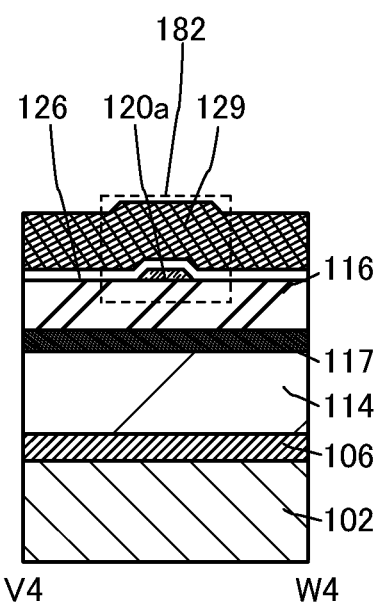

FIG. 4A is a plan view of the semiconductor device, FIG. 4B corresponds to a cross-sectional view taken along line X4-Y4 in FIG. 4A, and FIG. 4C corresponds to a cross-sectional view taken along line V4-W4 in FIG. 4A. Note that in FIG. 4A, some components of the semiconductor device (e.g., a second gate insulating film 126) are omitted for simplicity.

The semiconductor device illustrated in FIGS. 4A to 4C includes a first transistor 180 including a first channel formation region 108 formed using a first semiconductor material 102, a second transistor 182 including a second channel formation region 120*a* formed using a second semiconductor material, which is provided above the first transistor 180, and an oxide insulating film 116 provided between the first transistor 180 and the second transistor 182. The oxide insulating film 116 is provided in contact with at least the second channel formation region 120*a*. An oxygen barrier film 123 which penetrates through the oxide insulating film 116 is provided around the second channel formation region 120*a*.

Further, the first transistor 180 includes a first gate insulating film 110 formed over the first channel formation region 108, a first gate electrode 112 formed at a position in contact with the first gate insulating film 110 and overlapping with the first channel formation region 108, a source region 104 and a drain region 106 which are formed so as to sandwich the first channel formation region 108. An interlayer insulating film 114 is formed over the first transistor 180 (specifically, over the source region 104 and the drain region 106).

Further, the second transistor 182 includes the second channel formation region 120*a* formed in an oxide semiconductor film 120, a second gate insulating film 126 formed over the second channel formation region 120*a*, a second gate electrode 129 formed at a position in contact with the second gate insulating film 126 and overlapping with the second channel formation region 120*a*, and a source electrode 122 and a drain electrode 124 which are electrically connected to the second channel formation region 120*a*.

As the oxide insulating film 116, an oxygen release type oxide insulating film which releases oxygen by heating is preferably used.

As the oxygen barrier film 123, a film having low oxygen permeability is preferably used, and in the structure illustrated in FIGS. 4A to 4C, a conductive material is used. As the oxygen barrier film 123, for example, a metal film formed of metal selected from aluminum, ruthenium, iridium, hafnium, and tantalum, a metal oxide film formed of oxide thereof, or a metal nitride film formed of nitride thereof is preferably used. In the structure illustrated in FIGS. 4A to 4C, a ruthenium oxide film is used as the oxygen barrier film 123.

Note that, in the structure illustrated in FIGS. 4A to 4C, the oxygen barrier film 123 functions as part of the source electrode 122 and the drain electrode 124. With such a structure, the oxygen barrier film 123 can be used as part of a connection electrode between the first transistor 180 and the second transistor 182. Specifically, the oxygen barrier film 123 connects the first gate electrode 112 of the first transistor 180 to the source electrode 122 of the second transistor 182.

As illustrated in FIGS. 4A to 4C, by providing the oxygen barrier film 123, when the oxide insulating film 116 is heated, a diffusion of oxygen from the oxide insulating film 116 formed below the oxide semiconductor film 120 in the horizontal direction can be suppressed and oxygen can be preferably supplied to the oxide semiconductor film 120 (in particular, the second channel formation region 120*a*).

Further, the semiconductor device in FIGS. 4A to 4C is different from the semiconductor device in FIGS. 2A to 2C in a form of the second gate electrode 129. As in the second transistor 182 in FIGS. 4A to 4C, part of the second gate electrode 129 may overlap with part of the source electrode 122 and the drain electrode 124.

Furthermore, the semiconductor device in FIGS. 4A to 4C is different from the semiconductor device in FIGS. 2A to 2C in that a back gate electrode 117 is provided between the interlayer insulating film 114 and the oxide insulating film 116. The back gate electrode 117 functions as a back gate electrode of the second transistor 182. By providing the back gate electrode 117, a threshold voltage of the second transistor 182 can be adjusted with the back gate electrode 117. For example, voltage is applied to the back gate electrode 117, whereby a threshold voltage of the second transistor 182 can be adjusted in the positive direction. In this manner, the structure of the second transistor is not particularly limited, and a practitioner may select the most suitable structure as appropriate.

As described above, in each of the semiconductor devices illustrated in FIGS. 1A to 1C, FIGS. 2A to 2C, FIGS. 3A to 3C, and FIGS. 4A to 4C, an oxygen release type oxide insulating film is formed in contact with a channel formation region and oxygen is supplied from the oxide insulating film to an oxide semiconductor film in a transistor including the channel formation region in the oxide semiconductor film. Further, an oxygen barrier film is formed around the channel formation region, whereby a diffusion of oxygen to a wiring, an electrode, and the like which are connected to the transistor can be suppressed. Thus, a semiconductor device with a high reliability can be obtained.

This embodiment can be combined with any of the other embodiments as appropriate.

(Embodiment 2)

Figure 5:
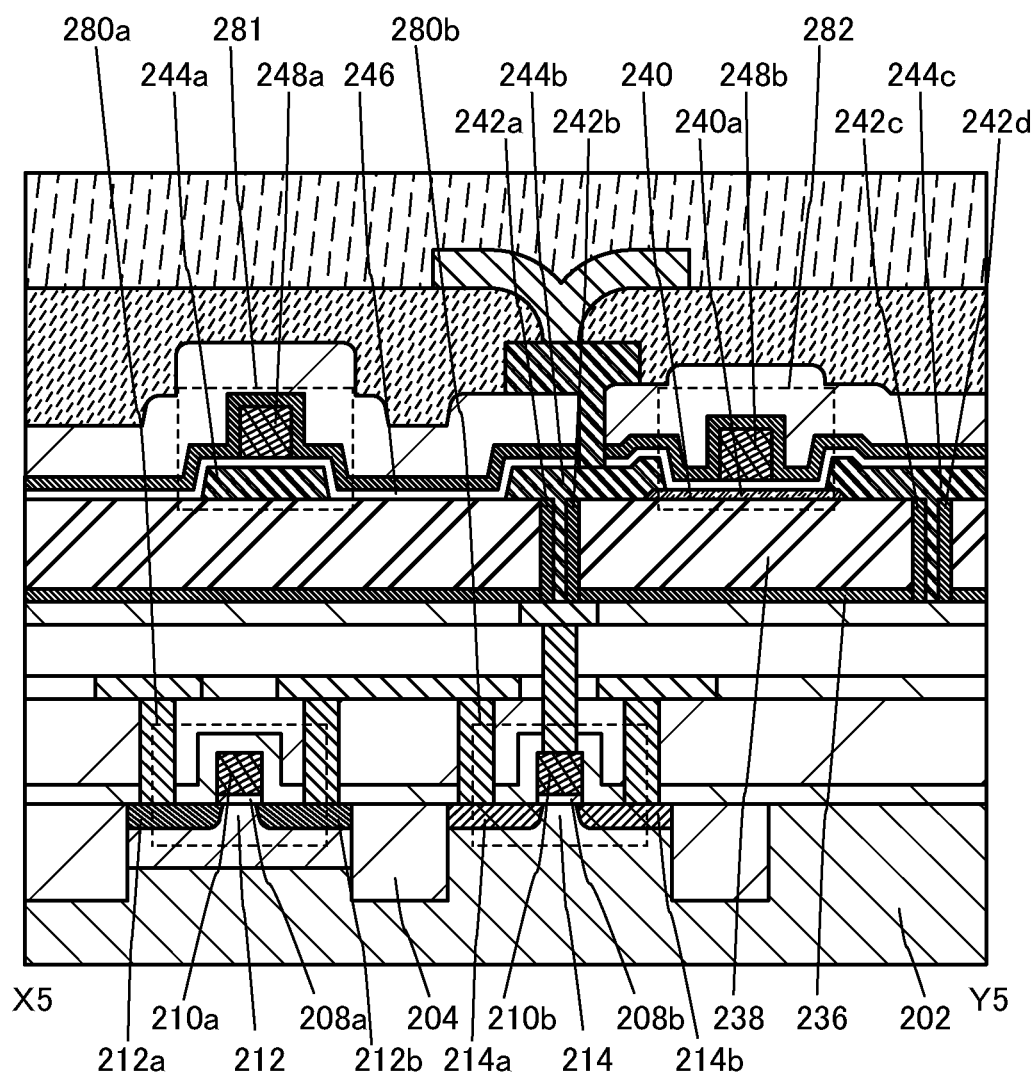
FIG. 5 illustrates an embodiment of a semiconductor device.

This embodiment is different from the semiconductor devices in Embodiment 1, and a more detailed structure is described with reference to FIG. 5, and then, a manufacturing method of the semiconductor device in FIG. 5 is described with reference to FIGS. 6A to 6D, FIGS. 7A to 7C, FIGS. 8A and 8B, FIGS. 9A and 9B, FIGS. 10A and 10B, and FIGS. 11A and 11B.

Note that in each of FIG. 5, FIGS. 6A to 6D, FIGS. 7A to 7C, FIGS. 8A and 8B, FIGS. 9A and 9B, FIGS. 10A and 10B, and FIGS. 11A and 11B, a cross-sectional view taken along line X5-Y5 corresponds to a cross-sectional view in the channel length direction of the second transistor 282.

The semiconductor device illustrated in FIG. 5 includes a first p-channel transistor 280a including a first channel formation region 212 formed using a first semiconductor material, a first n-channel transistor 280b including a first channel formation region 214 formed using the first semiconductor material, a second transistor 282 including a second channel formation region 240a formed using a second semiconductor material, which is provided above the first p-channel transistor 280a and the first n-channel transistor 280b, and an oxide insulating film 238 provided between the first p-channel transistor 280a and the first n-channel transistor 280b, and the second transistor 282. The oxide insulating film 238 is provided in contact with at least the second channel formation region 240a. Oxygen barrier films 242a, 242b, 242c, and 242d which penetrate through the oxide insulating film 238 are provided around the second channel formation region 240a.

Further, the first p-channel transistor 280a includes a first gate insulating film 208a formed over the first channel formation region 212, a first gate electrode 210a formed at a position in contact with the first gate insulating film 208a and overlapping with the first channel formation region 212, and a source region 212a and a drain region 212b which are formed so as to sandwich the first channel formation region 212.

Further, the first n-channel transistor 280b includes a first gate insulating film 208b formed over the first channel formation region 214, a first gate electrode 210b formed at a position in contact with the first gate insulating film 208b and overlapping with the first channel formation region 214, and a source region 214a and a drain region 214b which are formed so as to sandwich the first channel formation region 214.

As in the first p-channel transistor 280a and the first n-channel transistor 280b illustrated in FIG. 5, as the first transistor formed using the first semiconductor material, a plurality of transistors having differing polarities may be used.

Further, the second transistor 282 includes the second channel formation region 240a formed in an oxide semiconductor film 240, a second gate insulating film 246 formed over the second channel formation region 240a, a second gate electrode 248b formed at a position in contact with the second gate insulating film 246 and overlapping with the second channel formation region 240a, and a source electrode 244b and a drain electrode 244c which are electrically connected to the second channel formation region 240a.

Further, in FIG. 5, the second transistor 282 and a capacitor 281 are formed over the same plane. The capacitor 281 includes an electrode 244a formed in the same step as the source electrode 244b and the drain electrode 244c, the second gate insulating film 246, and an electrode 248a formed in the same step as the second gate electrode 248b. Note that in the capacitor 281, the second gate insulating film 246 has a function as a dielectric.

As the oxide insulating film 238 which is an oxygen release type oxide insulating film, an oxide insulating film which releases oxygen by heating is preferably used.

As the oxygen barrier films 242a, 242b, 242c, and 242d, a film having low oxygen permeability is preferably used. As the oxygen barrier films 242a, 242b, 242c, and 242d, for example, a metal film formed of metal selected from aluminum, ruthenium, iridium, hafnium, and tantalum, a metal oxide film formed of oxide thereof, or a metal nitride film formed of nitride thereof is preferably used. In the structure illustrated in FIG. 5, an aluminum oxide film is used as the oxygen barrier films 242a, 242b, 242c, and 242d.

As illustrated in FIG. 5, by providing the oxygen barrier films 242a, 242b, 242c, and 242d, when the oxide insulating film 238 is heated, a diffusion of oxygen from the oxide insulating film 238 formed below the oxide semiconductor film 240 in the horizontal direction can be suppressed and oxygen can be preferably supplied to the oxide semiconductor film 240 (in particular, the second channel formation region 240a).

Note that in the structure illustrated in FIG. 5, an oxygen barrier film 236 is provided below the oxide insulating film 238. With such a structure, the diffusion of oxygen which is released from the oxide insulating film 238 to the first transistors side (the first p-channel transistor 280a and the first n-channel transistor 280b) can be suppressed, and when the oxide insulating film 238 is heated, oxygen can be preferably supplied to the oxide semiconductor film 240 (in particular, the second channel formation region 240a).

Other components of the semiconductor device illustrated in FIG. 5 is described in detail in the manufacturing method of the semiconductor device illustrated in FIGS. 6A to 6D, FIGS. 7A to 7C, FIGS. 8A and 8B, FIGS. 9A and 9B, FIGS. 10A and 10B, and FIGS. 11A and 11B.

First, as the first semiconductor material, an n-type semiconductor substrate 202 is used. Then, after an element isolation region 204 is formed in the n-type semiconductor substrate 202, a p-well region 206 is formed in part of the n-type semiconductor substrate 202 (see FIG. 6A).

As the n-type semiconductor substrate 202, a single crystal silicon substrate (a silicon wafer) having n-type conductivity or a compound semiconductor substrate (e.g., a SiC substrate, or a GaN substrate) can be used.

Instead of the n-type semiconductor substrate 202, the following substrate may be used as a silicon on insulator (SOI) substrate: a so-called separation by implanted oxygen (SIMOX) substrate which is formed in such a manner that after an oxygen ion is implanted into a mirror-polished wafer, an oxide layer is formed at a certain depth from the surface and defects generated in a surface layer are eliminated by high temperature heating; or an SOI substrate formed by a technique called a Smart-Cut method in which a semiconductor substrate is cleaved by utilizing growth of a minute void formed by implantation of a hydrogen ion, by heat treatment, or the like.

The element isolation region 204 is formed by a local oxidation of silicon (LOCOS) method, a shallow trench isolation (STI) method, or the like.

An impurity element imparting p-type conductivity, such as boron, is added to the p-well region 206 at a concentration of approximately higher than or equal to $5\times10^{15}$ atoms/cm$^3$ and lower than or equal to $1\times10^{16}$ atoms/cm$^3$. The p-well region 206 is formed in such a manner that a mask is formed over part of the n-type semiconductor substrate 202 and an impurity element imparting p-type conductivity is added to part of the n-type semiconductor substrate 202.

Note that although the n-type semiconductor substrate is used here, a p-type semiconductor substrate may be used and an n-well region to which an impurity element imparting n-type conductivity, such as phosphorus or arsenic, is added may be formed in the p-type semiconductor substrate.

Figure 6A:
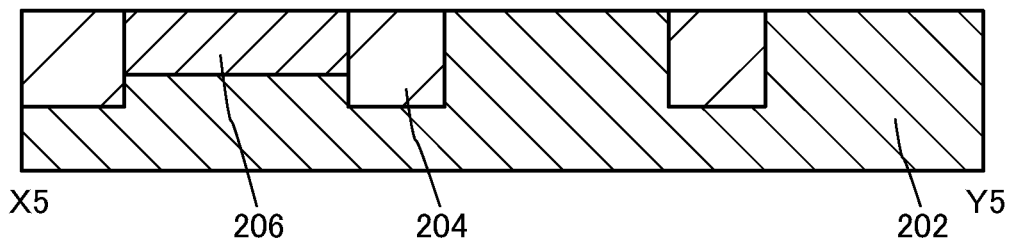
FIGS. 6A to 6D illustrate an embodiment of a method for manufacturing a semiconductor device.
Figure 6B:
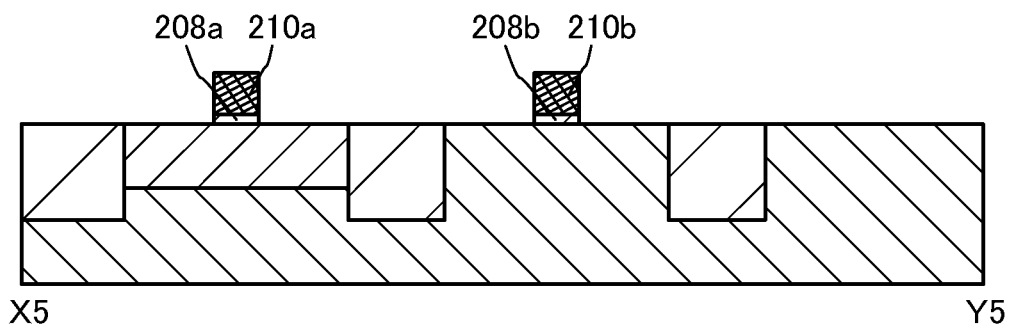
Figure 6C:
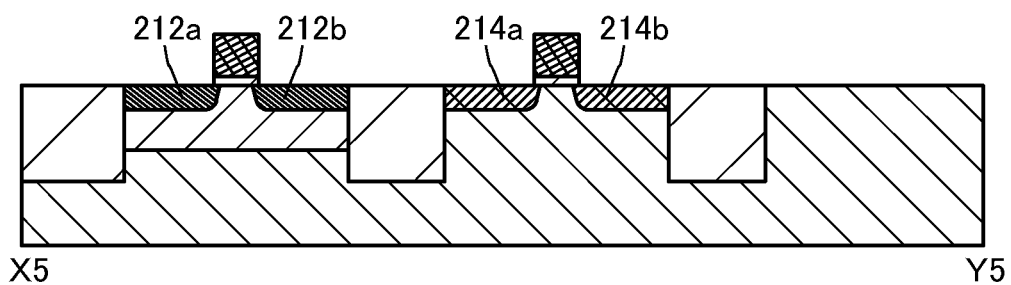

Next, first gate insulating films 208a and 208b, and first gate electrodes 210a and 210b are formed over the semiconductor substrate 202 (see FIG. 6B).

The first gate insulating films 208a and 208b can be formed in the following manner. A surface of the semiconductor substrate 202 is oxidized by heat treatment, so that a silicon oxide film is formed, or after the silicon oxide film is formed by a thermal oxidation method, the surface of the silicon oxide film is nitrided by nitriding treatment, so that a stack of the silicon oxide film and a silicon film including oxygen and nitrogen (a silicon oxynitride film) is formed. After that, a conductive film is formed over the silicon oxide film or the silicon oxynitride film and a patterning is performed on the conductive film, so that the first gate electrodes 210a and 210b are formed and the silicon oxide film or the silicon oxynitride film is etched using the first gate electrodes 210a and 210b as a mask, so that the first gate insulating films 208a and 208b are formed.

Alternatively, the first gate insulating films 208a and 208b may be formed over the semiconductor substrate 202 in such a manner that silicon oxide, silicon oxynitride, a metal oxide such as tantalum oxide, hafnium oxide, hafnium silicate oxide, zirconium oxide, aluminum oxide, or titanium oxide, which is a high dielectric constant material (also referred to as a high-k material), a rare-earth oxide such as lanthanum oxide, or the like is formed to have a thickness of 5 nm to 50 nm by a plasma CVD method, a sputtering method, or the like, and then part thereof is selectively etched.

It is preferable that the first gate electrodes 210a and 210b each be formed using a metal selected from tantalum, tungsten, titanium, molybdenum, chromium, niobium, and the like, or an alloy material or a compound material including any of the metals as its main component. Further, polycrystalline silicon to which an impurity such as phosphorus is added can be used. Alternatively, the first gate electrodes 210a and 210b may have a stacked structure including a metal nitride film and a film of any of the above metals. As the metal nitride, tungsten nitride, molybdenum nitride, or titanium nitride can be used. When the metal nitride film is provided, adhesiveness of the metal film can be increased; accordingly, separation can be prevented.

The first gate electrodes 210a and 210b are formed in such a manner that a conductive film is formed by a sputtering method, a plasma CVD method, an evaporation method, or the like and then part of the conductive film is selectively etched.

In this embodiment, the surface of the semiconductor substrate 202 is oxidized by heat treatment, so that a silicon oxide film is formed; a conductive film including a stack of a tantalum nitride film and a tungsten film is formed over the silicon oxide film by a sputtering method; and then part of the silicon oxide film and part of the conductive film are selectively etched. Thus, the first gate insulating films 208a and 208b and the first gate electrodes 210a and 210b are formed.

Note that for high integration, a structure in which sidewall insulating films are not provided on side surfaces of the first gate electrodes 210a and 210b is preferable. On the other hand, when the characteristics of the transistors have priority, sidewall insulating films may be provided on the side surfaces of the first gate electrodes 210a and 210b.

Next, an impurity element imparting n-type conductivity is added to the p-well region 206 using the first gate electrode 210a as a mask, so that an n-type source region 212a and an n-type drain region 212b are formed. Further, an impurity element imparting p-type conductivity is added to the semiconductor substrate 202 using the first gate electrode 210b as a mask, so that a p-type source region 214a and a p-type drain region 214b are formed (see FIG. 6C).

The concentration of the impurity element imparting n-type conductivity in the n-type source region 212a and the n-type drain region 212b is higher than or equal to $1\times10^{19}$ atoms/cm$^3$ and lower than or equal to $1\times10^{21}$ atoms/cm$^3$, and the concentration of the impurity element imparting p-type conductivity in the p-type source region 214a and the p-type drain region 214b is higher than or equal to $1\times10^{19}$ atoms/cm$^3$ and lower than or equal to $1\times10^{21}$ atoms/cm$^3$. The impurity element imparting n-type conductivity and the impurity element imparting p-type conductivity are added to the p-well region 206 and the semiconductor substrate 202, respectively, by an ion doping method, an ion implantation method, or the like as appropriate.

Further, in the case where the sidewall insulating films are provided on the side surfaces of the first gate electrodes 210a and 210b, in a region overlapping with the sidewall insulating films, an impurity region having different impurity concentration from the n-type source region 212a and the n-type drain region 212b, and the p-type source region 214a and the p-type drain region 214b can be formed.

Figure 6D:
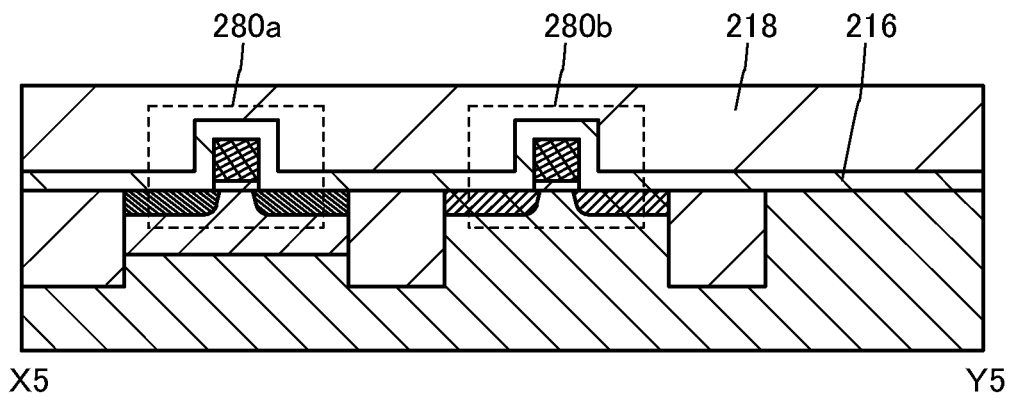

Next, insulating films 216 and 218 are formed over the semiconductor substrate 202, the element isolation region 204, the first gate insulating films 208a and 208b, and the first gate electrodes 210a and 210b by a sputtering method, a plasma CVD method, a coating method, or the like (see FIG. 6D).

The insulating films 216 and 218 may each be formed with a single layer or a stack including one or more of silicon oxide, silicon oxynitride, silicon nitride oxide, silicon nitride, aluminum oxide, aluminum oxynitride, aluminum nitride oxide, aluminum nitride, and the like. When the insulating film 216 is formed by a CVD method, a hydrogen content of the insulating film 216 can be increased. Thus, by heat treatment, the semiconductor substrate 202 is hydrogenated and dangling bonds are terminated by hydrogen, so that defects in the semiconductor substrate 202 can be reduced.

Note that planarity of the insulating film 218 can be high when the insulating film 218 is formed using an organic material such as a polyimide-based resin or an acrylic-based resin.

After the insulating films 216 and 218 are formed, heat treatment is performed to activate the impurity elements which are added to the n-type source region 212a and the n-type drain region 212b, and the p-type source region 214a and the p-type drain region 214b.

Through these steps, the first p-channel transistor 280a and the first n-channel transistor 280b formed using the first semiconductor material can be manufactured.

Next, part of the insulating films 216 and 218 is selectively etched, so that openings reaching the n-type source region 212a and the n-type drain region 212b, and the p-type source region 214a and the p-type drain region 214b are formed and contact plugs 220a, 220b, 220c, and 220d are formed in the openings. Then, insulating films 222a, 222b, 222c, and 222d and wirings 224a, 224b, and 224c are formed over the insulating film 218 and the contact plugs 220a, 220b, 220c, and 220d (see FIG. 7A).

Typically the contact plugs 220a, 220b, 220c, and 220d can be formed in the following manner: a conductive film is formed by a sputtering method, a plasma CVD method, a plating method, or the like, and then planarization treatment is performed by a chemical mechanical polishing (CMP) method, an etching method, or the like, so that unnecessary portions of a surface of the conductive film is removed. Alternatively, the conductive film to be the contact plugs 220a, 220b, 220c, and 220d can be formed by forming tungsten silicide by a CVD method using a $WF_6$ gas and a $SiH_4$ gas so as to fill the openings with the conductive film.

The insulating films 222a, 222b, 222c, and 222d can be formed by forming an insulating film using the same material as the insulating film 216 by the sputtering method, the plasma CVD method, or the like and selectively etching part of the insulating film.

The wirings 224a, 224b, and 224c can be formed by forming a conductive film by the sputtering method, the plasma CVD method, or the like, and performing planarization treatment by the CMP method, the etching method, or the like to remove unnecessary portions of a surface of the conductive film.

The wirings 224a, 224b, and 224c are formed to have a single-layer structure or a stacked-layer structure including any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is stacked over a copper-magnesium-aluminum alloy film, and a three-layer structure in which a titanium film, an aluminum film, and a titanium film are stacked in this order can be given.

Note that a transparent conductive material containing indium oxide, tin oxide, or zinc oxide may be used.

Note that the contact plugs 220a, 220b, 220c, and 220d and the wirings 224a, 224b, and 224c may be formed by a dual damascene method.

Next, heat treatment or plasma treatment is preferably performed so that hydrogen, water, or the like contained in the insulating films 222a, 222b, 222c, and 222d and the wirings 224a, 224b, and 224c is released.

Figure 7A:
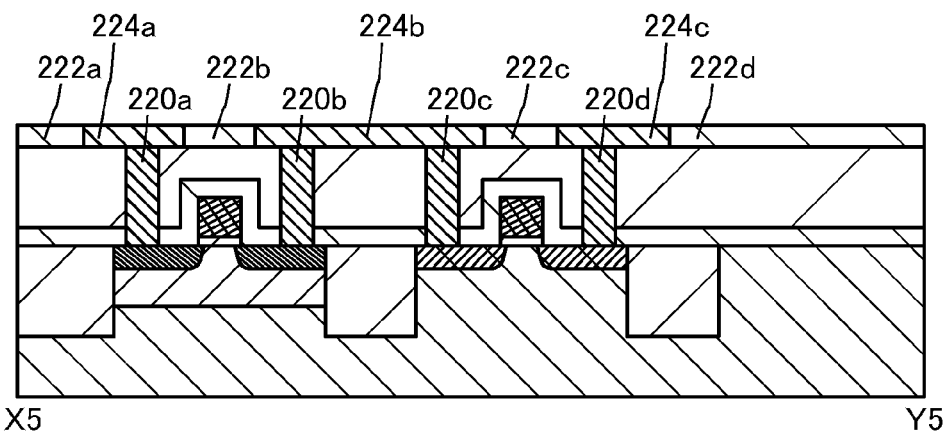
FIGS. 7A to 7C illustrate an embodiment of a method for manufacturing a semiconductor device.
Figure 7B:
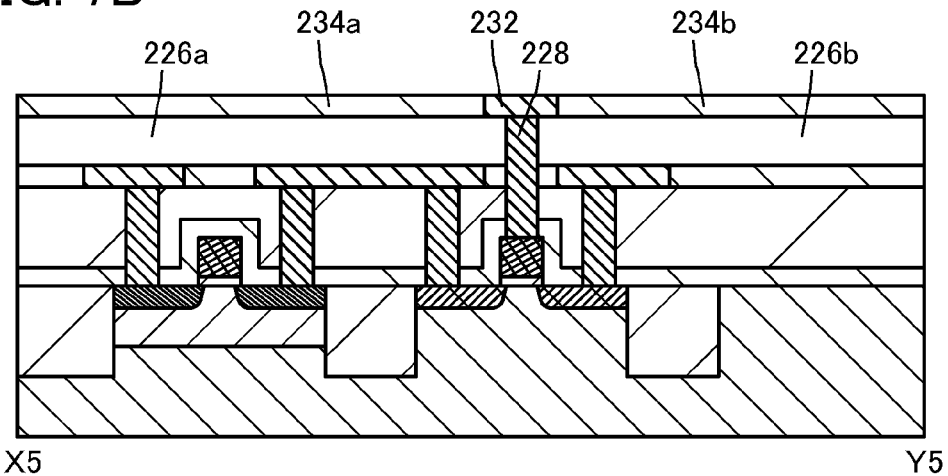

Next, insulating films 226a and 226b, a contact plug 228, insulating films 234a and 234b, and a wiring 232 are formed over the insulating films 222a, 222b, 222c, and 222d, and the wirings 224a, 224b, and 224c (see FIG. 7B).

The insulating films 226a and 226b can be formed using a method and a material similar to those of the insulating films 222a, 222b, 222c, and 222d. The contact plug 228 can be formed using a method and a material similar to those of the contact plugs 220a, 220b, 220c, and 220d. The insulating films 234a and 234b can be formed using a method and a material similar to those of the insulating films 222a, 222b, 222c, and 222d. The wiring 232 can be formed using a method and a material similar to those of the wirings, 224a, 224b, and 224c. Further, a back gate electrode may be formed at a position overlapping with the second channel formation region 240a of the second transistor 282 through the same process as the wiring 232.

In this embodiment, as the insulating films 234a and 234b, a silicon oxide film with a thickness of 300 nm formed by a sputtering method is used.

Note that the contact plug 228 and the wiring 232 may be formed by a dual damascene method.

As illustrated in FIG. 7B, the insulating films 234a and 234b and the wiring 232 which are planarized are used, whereby variation in electric characteristics of a transistor in which a channel formation region is formed in an oxide semiconductor film to be formed later can be reduced. Further, the transistor in which a channel formation region is formed in an oxide semiconductor film can be manufactured with a high yield.

Next, heat treatment or plasma treatment is preferably performed so that hydrogen, water, or the like contained in the insulating films 234a and 234b and the wiring 232 is released.

Figure 7C:
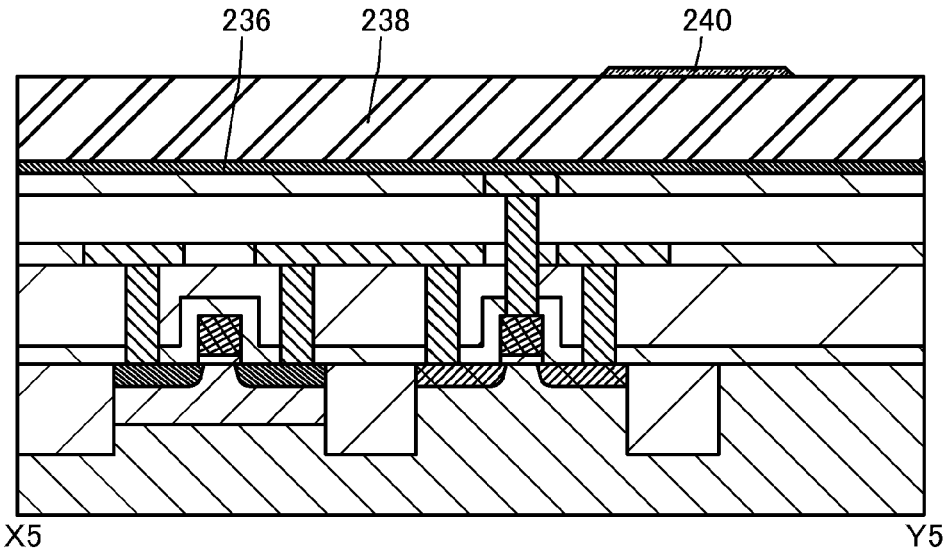

Next, an oxygen barrier film 236, an oxide insulating film 238, and an oxide semiconductor film 240 are formed over the insulating films 234a and 234b, and the wiring 232 (see FIG. 7C).

As the oxygen barrier film 236, a film having low oxygen permeability is preferably used. As the oxygen barrier film 236, for example, a metal film formed of metal selected from aluminum, ruthenium, iridium, hafnium, and tantalum, a metal oxide film formed of oxide thereof, or a metal nitride film formed of nitride thereof is preferably used. Further, a film including at least one of aluminum oxide, ruthenium, ruthenium oxide, iridium, iridium oxide, and tantalum nitride is more preferable. In this embodiment, as the oxygen barrier film 236, an aluminum oxide film with a thickness of 50 nm is used.

The oxide insulating film 238 can be formed with a single layer or a stacked layer using one or more of silicon oxide, silicon oxynitride, silicon nitride oxide, gallium oxide, hafnium oxide, yttrium oxide, aluminum oxide, and aluminum oxynitride, for example. The oxide insulating film 238 is preferably formed using an oxide insulating film from which part of oxygen is released by heating. As the oxide insulating film from which part of oxygen is released by heating, an oxide insulating film containing oxygen at a proportion exceeding the stoichiometric proportion is used.

The oxide insulating film from which part of oxygen is released by heating can diffuse oxygen into the oxide semiconductor film formed later by heating, because oxygen is released from the oxide insulating film by heating. For example, in the case where a silicon oxide film is used as the oxide insulating film 238, the composition formula is $SiO_{2+\alpha}$ ($\alpha>0$). By using the oxide insulating film 238, oxygen can be supplied to the oxide semiconductor film formed later, whereby oxygen vacancies in the oxide semiconductor film can be filled. A silicon oxide film with a thickness of 300 nm is formed by a sputtering method as the oxide insulating film 238 in this embodiment.

Further, the oxide insulating film 238 can be formed by the sputtering method, the plasma CVD method, or the like. For example, in the case where the oxide insulating film 238 is formed by the plasma CVD method, hydrogen or water derived from a source gas is sometimes mixed in the oxide insulating film 238. Thus, after the oxide insulating film 238 is formed by a plasma CVD method, heat treatment is preferably performed for dehydrogenation or dehydration. The heat treatment is preferably performed at a temperature at which hydrogen or water is released from the oxide insulating film 238.

An electric furnace, a rapid thermal annealing (RTA) apparatus, or the like can be used for the heat treatment. With the use of the RTA apparatus, the heat treatment can be performed at a temperature higher than or equal to the strain point of the substrate if the heating time is short. Thus, time during which hydrogen or water is released from the oxide insulating film 238 can be shortened.

By the heat treatment, dehydrogenation or dehydration can be performed on the oxide insulating film 238 and thus, a diffusion of hydrogen or water to the oxide semiconductor film formed later can be suppressed.

Moreover, in the case of adding oxygen to the oxide insulating film 238, the amount of oxygen released by heating can be increased. Oxygen can be added to the oxide insulating film 238 by an ion implantation method, an ion doping method, plasma treatment, or the like.

The heat treatment for dehydration or dehydrogenation may be performed plural times, and may also serve as another heat treatment.

The oxide semiconductor film 240 can be formed by forming an oxide semiconductor film over the oxide insulating film 238 and processing the film into a desired shape. In this embodiment, as the oxide semiconductor film 240, an In—Ga—Zn-based oxide (IGZO) film with a thickness of 20 nm is used.

The oxide semiconductor film 240 may have either a single-layer structure or a stacked-layer structure. Further, the oxide semiconductor layer may either have an amorphous structure or a crystalline structure. In the case where the oxide semiconductor film 240 has an amorphous structure, heat treatment may be performed on the oxide semiconductor film 240 in a later manufacturing step so that the oxide semiconductor film has crystallinity. The heat treatment for crystallizing the amorphous oxide semiconductor film is performed at a temperature higher than or equal to 250° C. and lower than or equal to 700° C., preferably higher than or equal to 400° C., further preferably higher than or equal to 500° C., still further preferably higher than or equal to 550° C. Note that the heat treatment can also serve as another heat treatment in the manufacturing process.

The oxide semiconductor film 240 can be formed by a sputtering method, a molecular beam epitaxy (MBE) method, a plasma CVD method, a pulse laser deposition method, an atomic layer deposition (ALD) method, or the like as appropriate.

When the oxide semiconductor film 240 is formed, it is preferable that the concentration of hydrogen contained in the oxide semiconductor film 240 be reduced as much as possible. In order to reduce the hydrogen concentration, for example, in the case where a sputtering method is used for film formation, a high-purity rare gas (typically, argon) from which impurities such as hydrogen, water, a hydroxyl group, and a hydride have been removed; oxygen; or a mixed gas of oxygen and the rare gas is used as appropriate as an atmosphere gas supplied to a deposition chamber of a sputtering apparatus.

The oxide semiconductor film 240 is formed in such a manner that a sputtering gas from which hydrogen and water have been removed is introduced into the deposition chamber while moisture remaining in the deposition chamber is removed, whereby the hydrogen concentration in the formed oxide semiconductor film 240 can be reduced. In order to remove moisture remaining in the deposition chamber, an entrapment vacuum pump such as a cryopump, an ion pump, or a titanium sublimation pump is preferably used. A turbo molecular pump provided with a cold trap may be used. The cryopump has a high capability in removing a hydrogen molecule, a compound containing a hydrogen atom such as water ($H_2O$) (more preferably, also a compound containing a carbon atom), and the like; thus, the impurity concentration in the oxide semiconductor film 240 formed in the deposition chamber which is evacuated with the cryopump can be reduced.

Note that in this embodiment, the oxide semiconductor film 240 is formed by a sputtering method using a metal oxide target with an atomic ratio of In:Ga:Zn=1:1:1. Note that the target that can be used for forming the oxide semiconductor film 240 is not limited to the target including the above materials with the above ratios. Further, the oxide semiconductor film 240 can be formed by a sputtering method in a rare gas (typically argon) atmosphere, an oxygen atmosphere, or a mixed atmosphere of a rare gas and oxygen. Further, the target that can be used for forming the oxide semiconductor film 240 preferably has crystallinity; that is, a single crystalline target, a polycrystalline target, or the like are preferably used. With the use of the target having crystallinity, a formed thin film also has crystallinity; specifically, the formed thin film tends to have a c-axis-aligned crystal.

In addition, the oxide semiconductor film 240 immediately after being formed is preferably in a supersaturated state where the amount of oxygen exceeds the amount of oxygen in the stoichiometric composition. For example, when the oxide semiconductor film 240 is formed by a sputtering method, it is preferable that the film be formed in a film formation gas containing a high percentage of oxygen, and it is especially preferable that the film be formed under an oxygen atmosphere (oxygen gas 100%). For example, when the oxide semiconductor film 240 is formed using an In—Ga—Zn-based oxide (IGZO) under a condition that the proportion of oxygen in the film formation gas is large (in particular, oxygen gas: 100%), Zn release from the film can be suppressed even when the film formation temperature is 300° C. or higher.

Further, when the oxide semiconductor film 240 is formed using the above metal oxide target with the atomic ratio of In:Ga:Zn=1:1:1, the composition of the target is different from the composition of a thin film formed over the substrate in some cases. For example, when the metal oxide target with the atomic ratio of In:Ga:Zn=1:1:1 is used, the composition ratio of the oxide semiconductor film 240, which is the thin film, becomes In:Ga:Zn=1:1:0.6 to 1:1:0.8 in an atomic ratio in some cases, though it depends on the film formation conditions. This is because in formation of the oxide semiconductor film 240, Zn is sublimed, or because a sputtering rate differs between the components of In, Ga, and Zn.

Accordingly, when a thin film having a preferable composition ratio is formed, a composition ratio of the metal oxide target needs to be adjusted in advance. For example, in order to make the composition ratio of the thin oxide semiconductor film 240 be In:Ga:Zn=1:1:1 in an atomic ratio, the composition ratio of the metal oxide target is made to be In:Ga:Zn=1:1:1.5 in an atomic ratio. In other words, the content percentage of Zn in the metal oxide target is preferably made higher in advance. The composition ratio of the target is not limited to the above value, and can be adjusted as appropriate depending on the film formation conditions or the composition of the thin film to be formed. Further, it is preferable to increase the content percentage of Zn in the metal oxide target because in that case, the obtained thin film can have higher crystallinity.

Further, in the case where the oxide semiconductor film 240 is formed by a sputtering method, the relative density of the metal oxide target which is used for forming the oxide semiconductor film 240 is greater than or equal to 90% and less than or equal to 100%, preferably greater than or equal to 95%, more preferably greater than or equal to 99.9%. With the use of the metal oxide target with a high relative density, the formed oxide semiconductor film 240 can be a dense film.

An oxide semiconductor to be used for the oxide semiconductor film 240 preferably contains at least indium (In) or zinc (Zn). In particular, both In and Zn are preferably contained. As a stabilizer for reducing variation in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn—O-based oxide" means an oxide containing In, Ga, and Zn as its main component and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material represented by $In_2SnO_5(ZnO)_n$ (n>0 is satisfied, n is an integer) may be used.

For example, an In—Ga—Zn-based oxide with an atomic ratio of In:Ga:Zn=1:1:1, In:Ga:Zn=2:2:1, In:Ga:Zn=3:1:2, or any of oxides whose composition is in the neighborhood of the above compositions can be used. Alternatively, an In—Sn—Zn-based oxide with an atomic ratio of In:Sn:Zn=1:1:1, In:Sn:Zn=2:1:3, or In:Sn:Zn=2:1:5, or any of oxides whose composition is in the neighborhood of the above compositions may be used.

However, without limitation to the materials given above, a material with an appropriate composition may be used depending on needed electric characteristics (e.g., mobility, threshold voltage, and variation). In order to obtain the required electric characteristics, it is preferable that the carrier concentration, the impurity concentration, the defect density, the atomic ratio between a metal element and oxygen, the interatomic distance, the density, and the like be set to appropriate values.

For example, high mobility can be obtained relatively easily in the case of using an In—Sn—Zn oxide. However, mobility can be increased by reducing the defect density in a bulk also in the case of using an In—Ga—Zn-based oxide.

For example, in the case where the composition of an oxide containing In, Ga, and Zn at the atomic ratio, In:Ga:Zn=a:b:c (a+b+c=1), is in the neighborhood of the composition of an oxide containing In, Ga, and, Zn at the atomic ratio, In:Ga:Zn=A:B:C (A+B+C=1), a, b, and c satisfy the following relation: $(a-A)^2+(b-B)^2+(c-C)^2 \leq r^2$, and r may be 0.05, for example. The same applies to other oxides.

Further, the oxide semiconductor film 240 may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, an oxide semiconductor film may include a CAAC-OS. In the CAAC-OS, for example, c-axes are aligned, and a-axes and/or b-axes are not macroscopically aligned.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

For example, an oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

Note that in most cases, a crystal part in the CAAC-OS film fits inside a cube whose one side is less than 100 nm In an image obtained with a transmission electron microscope (TEM), a boundary between crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electric characteristics due to irradiation with visible light or ultraviolet light is small. Thus, the transistor has high reliability.

There are three methods for obtaining a CAAC-OS film when the CAAC-OS film is used as the oxide semiconductor film 240. The first method is to form an oxide semiconductor layer at a film formation temperature higher than or equal to 100° C. and lower than or equal to 450° C., more preferably higher than or equal to 150° C. and lower than or equal to 400° C., thereby obtaining c-axis alignment substantially perpendicular to a surface. The second method is to form a thin oxide semiconductor film and then subject the film to heat treatment performed at a temperature higher than or equal to 200° C. and lower than or equal to 700° C., thereby obtaining c-axis alignment substantially perpendicular to a surface. The third method is to form a first thin oxide semiconductor film, subject the film to heat treatment performed at a temperature higher than or equal to 200° C. and lower than or equal to 700° C., and then form a second oxide semiconductor film, thereby obtaining c-axis alignment substantially perpendicular to a surface.

Note that when an oxide semiconductor film having crystallinity different from the CAAC-OS film (single crystal or microcrystalline) is formed as the oxide semiconductor film 240, the film formation temperature is not particularly limited.

The energy gap of the oxide semiconductor film 240 is 2.8 eV to 3.2 eV, and is greater than that of silicon (1.1 eV). The intrinsic carrier density of the oxide semiconductor film 240 is $10^{-9}/cm^3$, which is much smaller than the intrinsic carrier density of silicon ($10^{11}/cm^3$).

Majority carriers (electrons) of the oxide semiconductor film 240 flow only from a source of a transistor. Further, a channel formation region can be depleted completely. Thus, an off-state current of the transistor can be extremely small. The off-state current of the transistor including the oxide semiconductor film 240 is as small as 10 yA/µm or less at room temperature, and 1 zA/µm or less at 85° C. to 95° C.

Note that the oxide semiconductor film 240 may have a structure in which a plurality of oxide semiconductors is stacked. For example, the oxide semiconductor film 240 may have a stacked-layer structure of a first oxide semiconductor and a second oxide semiconductor which are formed using metal oxides with different compositions. For example, the first oxide semiconductor may be formed using a three-component metal oxide, and the second oxide semiconductor may be formed using a two-component metal oxide. Alternatively, both the first oxide semiconductor and the second oxide semiconductor may be formed using a three-component metal oxide.

Further, the constituent elements of the first oxide semiconductor and the second oxide semiconductor may be made to be the same and the composition of the constituent elements may be made to be different from each other. For example, the first oxide semiconductor may have an atomic ratio of In:Ga:Zn=1:1:1 and the second oxide semiconductor may have an atomic ratio of In:Ga:Zn=3:1:2. Alternatively, the first oxide semiconductor may have an atomic ratio of In:Ga:Zn=1:3:2 and the second oxide semiconductor may have an atomic ratio of In:Ga:Zn=2:1:3.

At this time, one of the first oxide semiconductor and the second oxide semiconductor which is closer to the gate electrode (on a channel side) preferably contains In and Ga at a proportion of In >Ga. The other which is farther from the gate electrode (on a back channel side) preferably contains In and Ga at a proportion of In≤Ga. In an oxide semiconductor, the s orbital of heavy metal mainly contributes to carrier transfer, and when the In content in the oxide semiconductor is increased, overlap of the s orbital is likely to be increased. Therefore, an oxide having a composition of In >Ga has higher mobility than an oxide having a composition of In≤Ga. Further, in Ga, the formation energy of oxygen vacancy is larger and thus oxygen vacancy is less likely to occur, than in In; therefore, the oxide having a composition of In≤Ga has more stable characteristics than the oxide having a composition of In >Ga. Thus, an oxide semiconductor containing In and Ga at a proportion of In >Ga is used on a channel side, and an oxide semiconductor containing In and Ga at a proportion of In≤Ga is used on a back channel side; so that the mobility and reliability of the transistor can be further improved.

Further, when the oxide semiconductor film 240 has a stacked-layer structure, the first oxide semiconductor and the second oxide semiconductor may be formed using oxide semiconductors having different crystallinity. That is, the oxide semiconductor film 240 may have a structure in which two of a single crystal oxide semiconductor, a polycrystalline oxide semiconductor, an amorphous oxide semiconductor, and an oxide semiconductor having crystallinity (for example, a CAAC-OS film) are combined as appropriate. When an amorphous oxide semiconductor is used for at least one of the first oxide semiconductor and the second oxide semiconductor, internal stress or external stress of the oxide semiconductor is relieved, variation in characteristics of a transistor is reduced, and reliability of the transistor can be further improved. On the other hand, in the amorphous oxide semiconductor, an impurity acting as a donor, such as hydrogen, is easily absorbed and oxygen deficiency easily occur; thus, the amorphous oxide semiconductor is likely to be n-type. Therefore, it is preferable that the oxide semiconductor having crystallinity (for example, a CAAC-OS film) be used for the oxide semiconductor on the channel side.

Before the oxide semiconductor film 240 is formed, planarization treatment may be performed on the surface on which the oxide semiconductor film 240 is to be formed. As the planarization treatment, the polishing treatment (e.g., the CMP method), the dry etching treatment, or the plasma treatment can be used, though there is no particular limitation on the planarization treatment.

As plasma treatment, reverse sputtering in which an argon gas is introduced and plasma is generated can be performed. The reverse sputtering is a method in which voltage is applied to a substrate side with the use of an RF power source in an argon atmosphere and plasma is generated in the vicinity of the substrate so that a substrate surface is modified. Note that instead of argon, nitrogen, helium, oxygen or the like may be used. The reverse sputtering can remove particle substances (also referred to as particles or dust) attached to the surface on which the oxide semiconductor film 240 is to be formed.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface on which the oxide semiconductor film 240 is to be formed.

Further, after the oxide semiconductor film 240 is formed, the oxide semiconductor film 240 is preferably subjected to heat treatment for reducing or removing excess hydrogen (including water and a hydroxyl group) contained in the oxide semiconductor film 240 (dehydration or dehydrogenation).

The heat treatment is performed at higher than or equal to 250° C. and lower than or equal to 650° C., preferably higher than or equal to 450° C. and lower than or equal to 600° C. or lower than the strain point of the substrate. For example, the substrate is introduced into an electric furnace which is one of heat treatment apparatuses, and heat treatment is performed on the oxide semiconductor film 240 at 650° C. for one hour in vacuum (under reduced pressure).

Note that the heat treatment apparatus is not limited to the electric furnace, and an apparatus for heating an object by heat conduction or heat radiation from a heater such as a resistance heater may be used. For example, an RTA apparatus such as a GRTA (gas rapid thermal annealing) apparatus or an LRTA (lamp rapid thermal annealing) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high temperature gas. As the high temperature gas, an inert gas which does not react with an object by heat treatment, such as nitrogen or a rare gas like argon, is used. Note that in the case where a GRTA apparatus is used as the heat treatment apparatus, the substrate may be heated in an inert gas heated to a high temperature of 650° C. to 700° C. because the heat treatment time is short.

The heat treatment enables reduction, more preferably removal of hydrogen, which is an impurity imparting n-type conductivity, in the oxide semiconductor film 240. Further, by this heat treatment, oxygen contained in the oxide insulating film 238 can be supplied to the oxide semiconductor film 240. While oxygen is released from the oxide semiconductor film 240 by the dehydration or dehydrogenation treatment, oxygen is supplied from the oxide insulating film 238 to the oxide semiconductor film 240, whereby oxygen vacancies in the oxide semiconductor film 240 can be filled.

Further, after the oxide semiconductor film 240 is heated through the heat treatment, a high-purity oxygen gas, a high-purity nitrous oxide gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew-point instrument of a cavity ring down laser spectroscopy (CRDS) system) may be introduced into the same furnace while the heating temperature is maintained or gradually decreased. It is preferable that water, hydrogen, or the like be not contained in the oxygen gas or the nitrous oxide gas. Alternatively, the purity of the oxygen gas or the nitrous oxide gas which is introduced into the heat treatment apparatus is preferably 6N or higher, further preferably 7N or higher (i.e., the impurity concentration in the oxygen gas or the nitrous oxide gas is preferably 1 ppm or lower, further preferably 0.1 ppm or lower). While oxygen is reduced by removing an impurity for the dehydration or dehydrogenation, the oxygen gas or the nitrous oxide gas acts to supply oxygen that is a main component of the oxide semiconductor film 240, so that the oxide semiconductor film 240 can have high purity and be an i-type (intrinsic) oxide semiconductor film.

The heat treatment for dehydration or dehydrogenation may serve as another heat treatment of a manufacturing process of the second transistor 282.

Figure 8A:
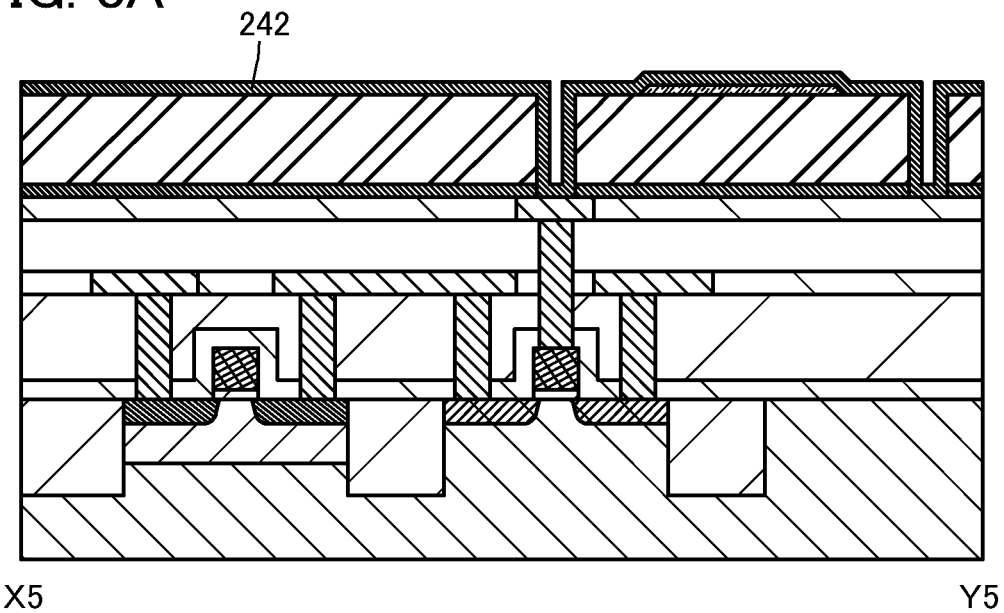
FIGS. 8A and 8B illustrate an embodiment of a method for manufacturing a semiconductor device.

Next, part of the oxygen barrier film 236 and the oxide insulating film 238 around the oxide semiconductor film 240 is selectively removed, and then an oxygen barrier film 242 is formed (see FIG. 8A).

As the oxygen barrier film 242, a film having low oxygen permeability is preferably used. As the oxygen barrier film 242, for example, a metal film formed of metal selected from aluminum, ruthenium, iridium, hafnium, and tantalum, a metal oxide film formed of oxide thereof, or a metal nitride film formed of nitride thereof is preferably used. Further, a film including at least one of aluminum oxide, ruthenium, ruthenium oxide, iridium, iridium oxide, and tantalum nitride is more preferable. In this embodiment, as the oxygen barrier film 242, an aluminum oxide film with a thickness of 50 nm is used.

Note that when part of the oxygen barrier film 236 and the oxide insulating film 238 is selectively removed, as illustrated in FIG. 8A, an opening is preferably formed at a position reaching the wiring 232. The opening is filled with a source electrode and a drain electrode which are formed later, whereby the first p-channel transistor 280a and the first n-channel transistor 280b can be electrically connected to the second transistor 282.

Figure 8B:
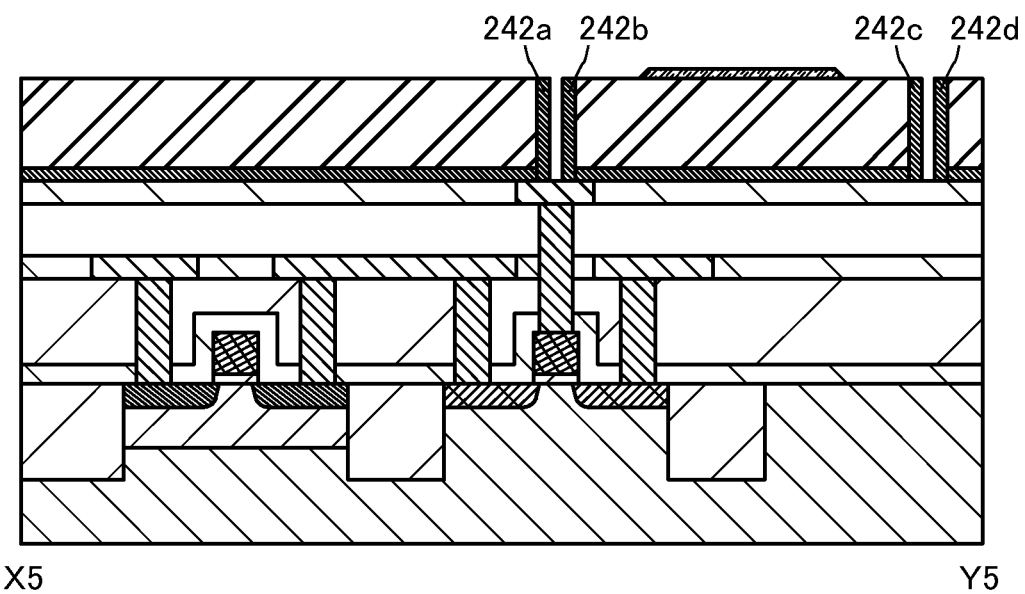

Next, part of the oxygen barrier film 242 is selectively removed, so that oxygen barrier films 242a, 242b, 242c, and 242d are formed (see FIG. 8B).

The oxygen barrier films 242a, 242b, 242c, and 242d may be formed by etching on the entire oxygen bather film 242 or by forming a resist mask in a desired region and removing the oxygen bather film 242 in an unnecessary region. In the case where the resist mask is formed in the desired region, at least a surface of the oxide semiconductor film 240 and part of a surface of the wiring 232 may be exposed, and the oxygen barrier film may be left on the oxide insulating film 238 in contact with an electrode 244a, a source electrode 244b, and a drain electrode 244c which are formed later.

Figure 9A:
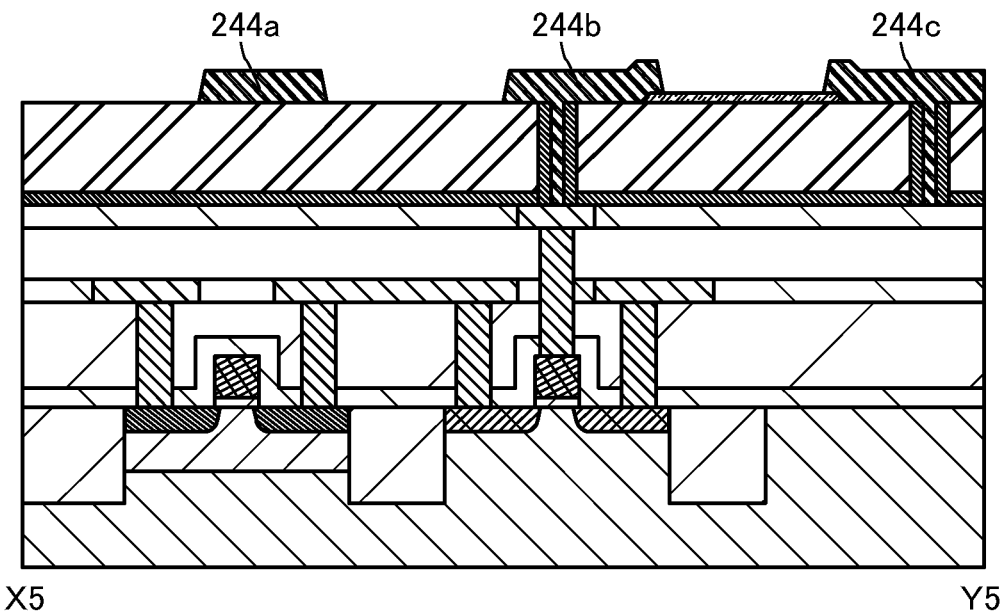
FIGS. 9A and 9B illustrate an embodiment of a method for manufacturing a semiconductor device.

Next, a conductive film is formed over the oxide insulating film 238 and the oxide semiconductor film 240 and the conductive film is formed in desired regions, so that an electrode 244a, a source electrode 244b, and a drain electrode 244c are formed (see FIG. 9A).

As the electrode 244a, the source electrode 244b, and the drain electrode 244c, for example, a metal film containing an element selected from aluminum, chromium, copper, tantalum, titanium, molybdenum, or tungsten, or a metal nitride film containing any of the above elements as its component (e.g., a titanium nitride film, a molybdenum nitride film, or a tungsten nitride film) can be used. Alternatively, the conductive film may have a structure in which a film of a high-melting-point metal such as titanium, molybdenum, or tungsten, or a nitride film of any of these metals (a titanium nitride film, a molybdenum nitride film, or a tungsten nitride film) is stacked on either or both of the bottom surface and the top surface of a metal film of aluminum, copper, or the like.

Further, the conductive film used for the electrode 244a, the source electrode 244b, and the drain electrode 244c may be formed using conductive metal oxide. As the conductive metal oxide, indium oxide ($In_2O_3$), tin oxide ($SnO_2$), zinc oxide (ZnO), indium tin oxide ($In_2O_3$—$SnO_2$, which is abbreviated to ITO in some cases), or indium zinc oxide ($In_2O_3$—ZnO) can be used. The conductive film used for the source electrode and the drain electrode can be formed using any of the above materials to have a single layer or a stacked structure. There is no particular limitation on the method for forming the layer including a conductive material, and any of a variety of film formation methods such as an evaporation method, a plasma CVD method, a sputtering method, and a spin coating method can be employed.

Figure 9B:
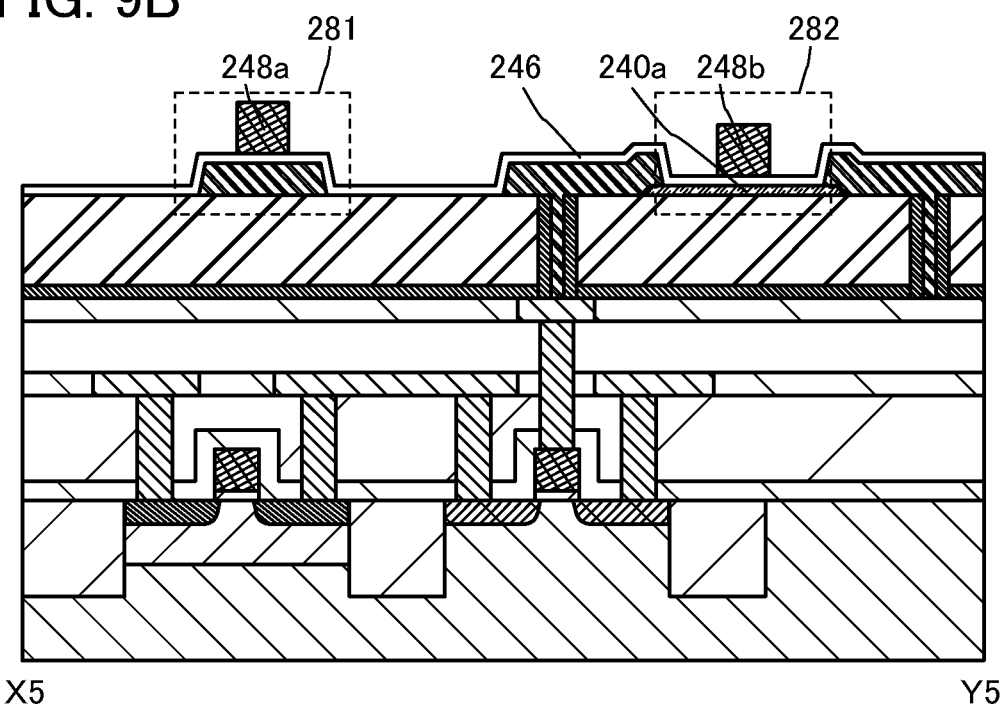

Next, a second gate insulating film 246 is formed over the oxide insulating film 238, the oxide semiconductor film 240, the electrode 244a, the source electrode 244b, and the drain electrode 244c, and an electrode 248a and a second gate electrode 248b are formed at a position in contact with the second gate insulating film 246 and overlapping with the electrode 244a and the oxide semiconductor film 240 (see FIG. 9B).

Note that in the oxide semiconductor film 240, a second channel formation region 240a is formed at a position overlapping with the second gate electrode 248b.

The second gate insulating film 246 can be formed using silicon oxide, gallium oxide, aluminum oxide, silicon nitride, silicon oxynitride, aluminum oxynitride, silicon nitride oxide, or the like. The second gate insulating film 246 can have a thickness greater than or equal to 1 nm and less than or equal to 500 nm, for example. There is no particular limitation on a method for forming the second gate insulating film 246; for example, a sputtering method, an MBE method, a plasma CVD method, a pulse laser deposition method, an ALD method, or the like can be used as appropriate. In this embodiment, as the second gate insulating film 246, an aluminum oxide film with a thickness of 20 nm is used.

For the electrode 248a and the second gate electrode 248b, it is possible to use a metal material such as molybdenum, titanium, tantalum, tungsten, aluminum, copper, neodymium, or scandium, or an alloy material containing any of these materials, for example. The electrode 248a and the second gate electrode 248b can be formed to have a single layer or a stacked structure using any of the above materials. There is no particular limitation on the formation method, and any of a variety of film formation methods such as an evaporation method, a plasma CVD method, and a sputtering method can be employed. In this embodiment, as the electrode 248a and the second gate electrode 248b, a stacked structure of a tantalum nitride film with a thickness of 30 nm and a tungsten film with a thickness of 135 nm is used.

Note that after the electrode 248a and the second gate electrode 248b are formed, impurity implantation treatment may be performed on the oxide semiconductor film 240 through the second gate insulating film 246 using the second gate electrode 248b as a mask.

For the impurity implantation treatment, an impurity to reduce the resistance of the oxide semiconductor film 240 may be used, and for example, any one or more of phosphorus (P), arsenic (As), antimony (Sb), boron (B), aluminum (Al), nitrogen (N), argon (Ar), helium (He), neon (Ne), indium (In), fluorine (F), chlorine (CO, titanium (Ti), and zinc (Zn) can be used. In this embodiment, phosphorus (P) is implanted as the impurity implantation treatment.

Note that at this stage, a capacitor 281 and a second transistor 282 in which the second channel formation region 240a is formed are formed.

Figure 10A:
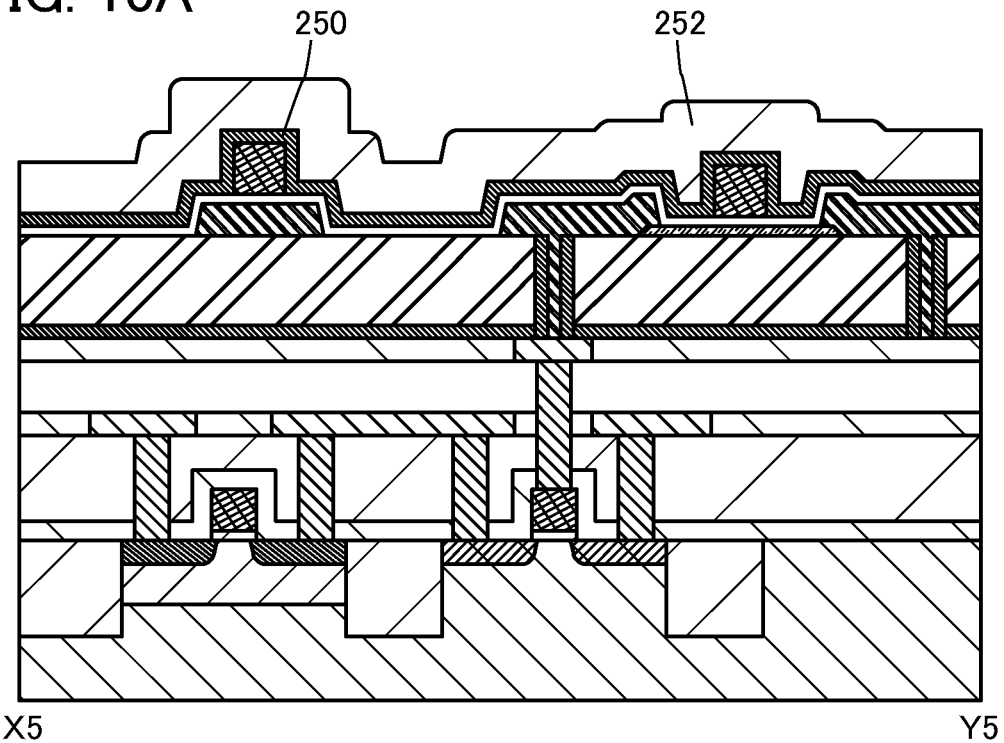
FIGS. 10A and 10B illustrate an embodiment of a method for manufacturing a semiconductor device.

Next, an insulating film 250 and an insulating film 252 are formed over the capacitor 281 and the second transistor 282 (specifically, over the second gate insulating film 246, the electrode 248a, and the second gate electrode 248b) (see FIG. 10A).

The insulating film 250 is preferably formed using an inorganic insulating film to have a single layer or a stacked layer of any of oxide insulating films such as a silicon oxide film, a silicon oxynitride film, an aluminum oxide film, an aluminum oxynitride film, a gallium oxide film, and a hafnium oxide film. Further, over the above oxide insulating film, a single layer or a stacked layer of any of nitride insulating films such as a silicon nitride film, a silicon nitride oxide film, an aluminum nitride film, and an aluminum nitride oxide film may be formed. There is no particular limitation on a method for forming the insulating film 250; for example, a sputtering method, an MBE method, a PE-CVD method, a pulse laser deposition method, an ALD method, or the like can be employed as appropriate. In this embodiment, an aluminum oxide film with a thickness of 50 nm is used for the insulating film 250.

The insulating film 252 can be formed using a material and a method similar to those of the insulating film 250. In this embodiment, as the insulating film 252, a silicon oxynitride film with a thickness of 300 nm is used.

Figure 10B:
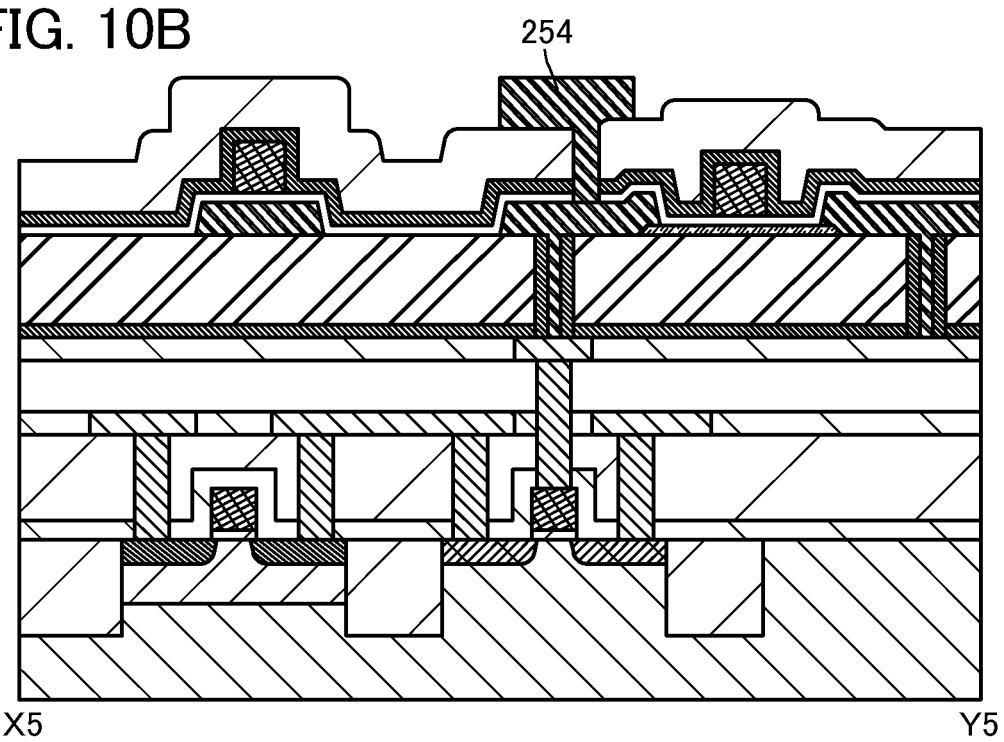

Next, part of the second gate insulating film 246, the insulating film 250, and the insulating film 252 is selectively removed, so that an opening reaching the source electrode 244b is formed, and then an electrode 254 is formed so as to fill the opening (see FIG. 10B).

The electrode 254 can be formed by forming a conductive film and removing only a desired region of the conductive film. The conductive film can be formed using a material and a method similar to those of the electrode 244a, the source electrode 244b, and the drain electrode 244c. In this embodiment, as the electrode 254, a stacked structure of a titanium film with a thickness of 50 nm, an aluminum film with a thickness of 200 nm, and a titanium film with a thickness of 50 nm is used.

Figure 11A:
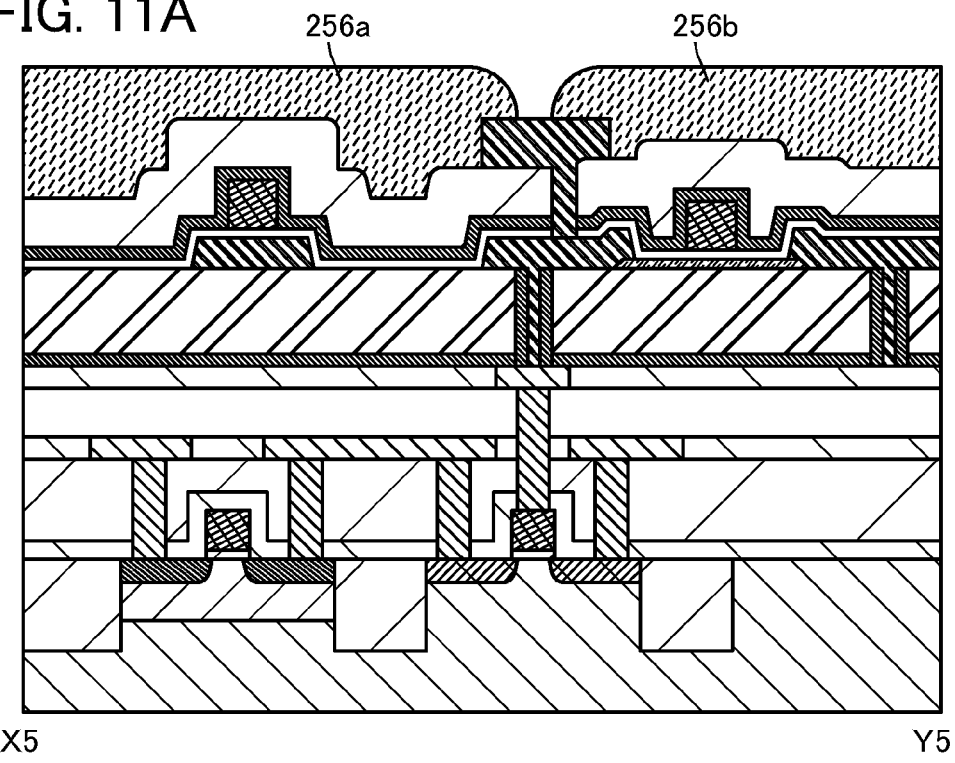
FIGS. 11A and 11B illustrate an embodiment of a method for manufacturing a semiconductor device.
Figure 11B:
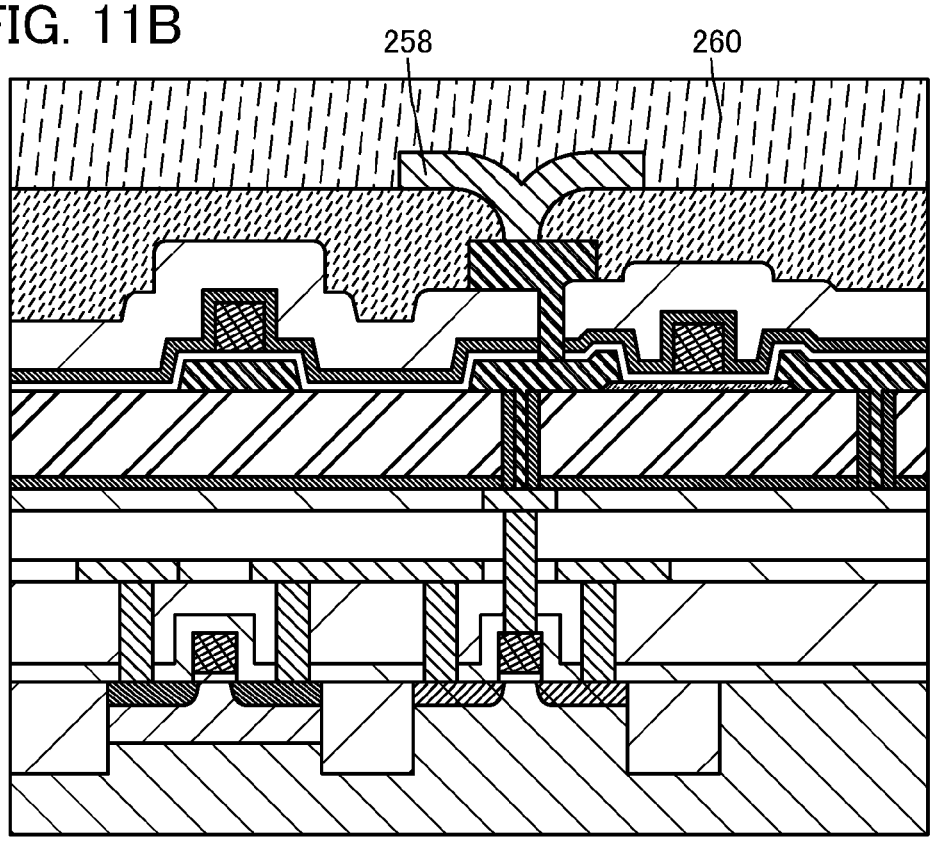

Next, an insulating film 256a and an insulating film 256b are formed over the insulating film 250 and the electrode 254 (see FIG. 11A).

As the insulating films 256a and 256b, an organic material such as a polyimide-based resin, an acrylic-based resin, or a benzocyclobutene-based resin can be used. Other than such organic materials, it is also possible to use a low-dielectric constant material (a low-k material) or the like. In the case of using an organic material, the insulating films 256a and 256b can be formed by a wet method such as a spin coating method or a printing method. In this embodiment, as the insulating films 256a and 256b, a polyimide-based resin film with a thickness of 1.5 μm is used.

Next, a conductive film is formed over the electrode 254 and the insulating films 256a and 256b and part of the conductive film is selectively etched, so that a wiring 258 is formed. After that, an insulating film 260 is formed over the insulating films 256a and 256b, and the wiring 258 (see FIG. 11B).

The wiring 258 can be formed using a material and a method similar to those of the electrode 244a, the source electrode 244b, and the drain electrode 244c. In this embodiment, as the wiring 258, a stacked structure of a titanium film with a thickness of 50 nm, an aluminum film with a thickness of 300 nm, and a titanium film with a thickness of 5 nm is used.

The insulating film 260 can be formed using a material and a method similar to those of the insulating films 256a and 256b. In this embodiment, as the insulating film 260, a polyimide-based resin film with a thickness of 1.5 μm is used.

Through the above steps, the semiconductor device illustrated in FIG. 5 can be manufactured.

As described above, in the semiconductor device illustrated in FIG. 5, an oxygen release type oxide insulating film is formed in contact with a channel formation region and oxygen is supplied from the oxide insulating film to an oxide semiconductor film in a transistor including the channel formation region in the oxide semiconductor film. Further, an oxygen bather film is formed around the channel formation region, whereby a diffusion of oxygen to a wiring, an electrode, and the like which are connected to the transistor can be suppressed. Thus, a semiconductor device with a high reliability can be obtained.

This embodiment can be implemented by being combined as appropriate with any of the above-described embodiments.

(Embodiment 3)

In this embodiment, an example of a circuit configuration of a semiconductor device which includes the semiconductor device illustrated in FIG. 5 of Embodiment 2, which can hold stored data even when not powered, and which does not have a limitation on the number of write cycles, will be described.

Figure 12:
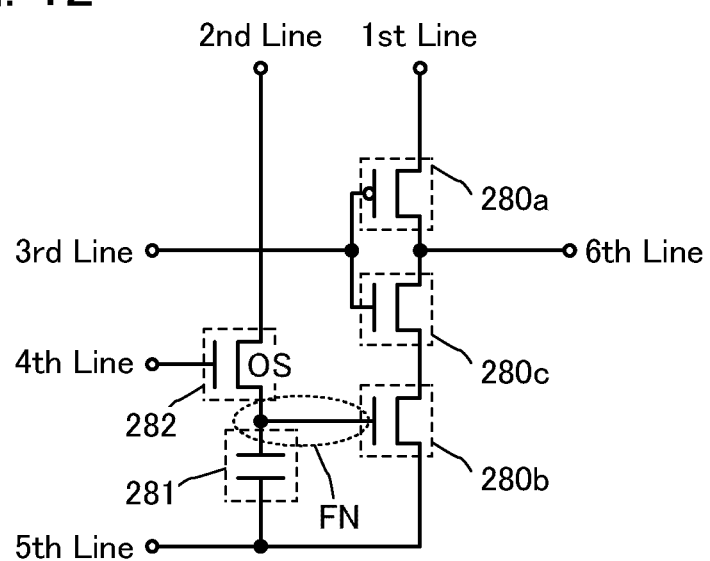
FIG. 12 is a circuit diagram illustrating an embodiment of a semiconductor device.

In FIG. 12, an example of a circuit configuration corresponding to the semiconductor device illustrated in FIG. 5 is illustrated.

In FIG. 12, a first wiring (1st Line) is electrically connected to one of the source electrode and the drain electrode of the first p-channel transistor 280a. Further, the other of the source electrode and the drain electrode of the first p-channel transistor 280a is electrically connected to one of the source electrode and the drain electrode of a first n-channel transistor 280c (which is not illustrated in FIG. 5). Further, the other of the source electrode and the drain electrode of the first n-channel transistor 280c is electrically connected to one of the source electrode and the drain electrode of the first n-channel transistor 280b.

A second wiring (2nd Line) is electrically connected to one of the source electrode and the drain electrode of the second transistor 282. Further, the other of the source electrode and the drain electrode of the second transistor 282, one electrode of the capacitor 281, and the gate electrode of the first n-channel transistor 280b are electrically connected to each other.

A third wiring (3rd Line) and the gate electrodes of the first p-channel transistor 280a and the first n-channel transistor 280c are electrically connected to each other. Further, a fourth wiring (4th Line) is electrically connected to the gate electrode of the second transistor 282. Further, a fifth wiring (5th Line), the other electrode of the capacitor 281, and the other of the source electrode and the drain electrode of the first n-channel transistor 280b are electrically connected to each other. Further, a sixth wiring (6th Line), the other of the source electrode and the drain electrode of the first p-channel transistor 280a, and one of the source electrode and the drain electrode of the first n-channel transistor 280c are electrically connected to each other.

As the second transistor 282 is formed using an oxide semiconductor (OS), in FIG. 12, the second transistor 282 is denoted by "OS".

Further, in FIG. 12, a floating node (FN) is written at a connection portion of the other of the source electrode and the drain electrode of the second transistor 282, the one electrode of the capacitor 281, and the gate electrode of the first n-channel transistor 280b. When the second transistor 282 is turned off, potentials supplied to the floating node, the one electrode of the capacitor 281, and the gate electrode of the first n-channel transistor 280b can be held.

The circuit configuration in FIG. 12 utilizes the advantage that the potential of the gate electrode of the first n-channel transistor 280b can be held, whereby writing, holding, and reading of data can be performed as described below.

First, writing and holding of data will be described. The potential of the fourth wiring is set to a potential at which the second transistor 282 is turned on, so that the second transistor 282 is turned on. Accordingly, the potential of the second wiring is supplied to the gate electrode of the first n-channel transistor 280b and the capacitor 281. That is, predetermined charge is supplied to the gate electrode of the first n-channel transistor 280b (writing).

After that, the potential of the fourth wiring is set to a potential at which the second transistor 282 is turned off, and the second transistor 282 is turned off. Accordingly, charge applied to the gate electrode of the first n-channel transistor 280b is held (holding).

Since the off-state current of the second transistor 282 is significantly small, the charge in the gate electrode of the first n-channel transistor 280b is held for a long time.

Next, reading of data is described. When the potential of the third wiring is a Low-level potential, the first p-channel transistor 280a is turned on and the first n-channel transistor 280c is turned off. At this time, the potential of the first wiring is applied to the sixth wiring. On the other hand, when the potential of the third wiring is a High-level potential, the first p-channel transistor 280a is turned off and the first n-channel transistor 280c is turned on. At this time, the potential of the sixth wiring varies in response to the amount of charge held in the floating node (FN). Therefore, the retained data can be read by measuring the potential of the sixth wiring (reading).

The second transistor 282 in which a channel formation region is formed using an oxide semiconductor has a significantly low off-state current. The off-state current of the second transistor 282 using an oxide semiconductor is lower than or equal to one hundred-thousandth of that of the off-state current of a transistor formed using a silicon semiconductor or the like; thus, loss of the electrical charge accumulated in the floating node due to leakage of the second transistor 282 is as small as negligible. That is, the second transistor 282 formed using an oxide semiconductor makes it possible to obtain a nonvolatile memory circuit which can hold data even without being supplied with power.

By applying the semiconductor device including the above-described circuit configuration to a memory device such as a register or a cache memory, data in the memory device can be prevented from being erased owing to the stop of the supply of the power supply voltage. In addition, after the supply of the power supply voltage is resumed, the storage element can return to the state same as that before the power supply voltage is stopped in a short time. Therefore, the power supply can be stopped even for a short time when the whole memory device or one or a plurality of logic circuits included in the memory device is in a standby state. Accordingly, power consumption can be suppressed.

The structures and methods described in this embodiment can be combined as appropriate with any of the structures and methods described in the other embodiments.

(Embodiment 4)

In this embodiment, a memory processing unit including the semiconductor device described in Embodiment 2, the circuit configuration described in Embodiment 3, and a plurality of circuits will be described with reference to FIG. 13.

Figure 13:
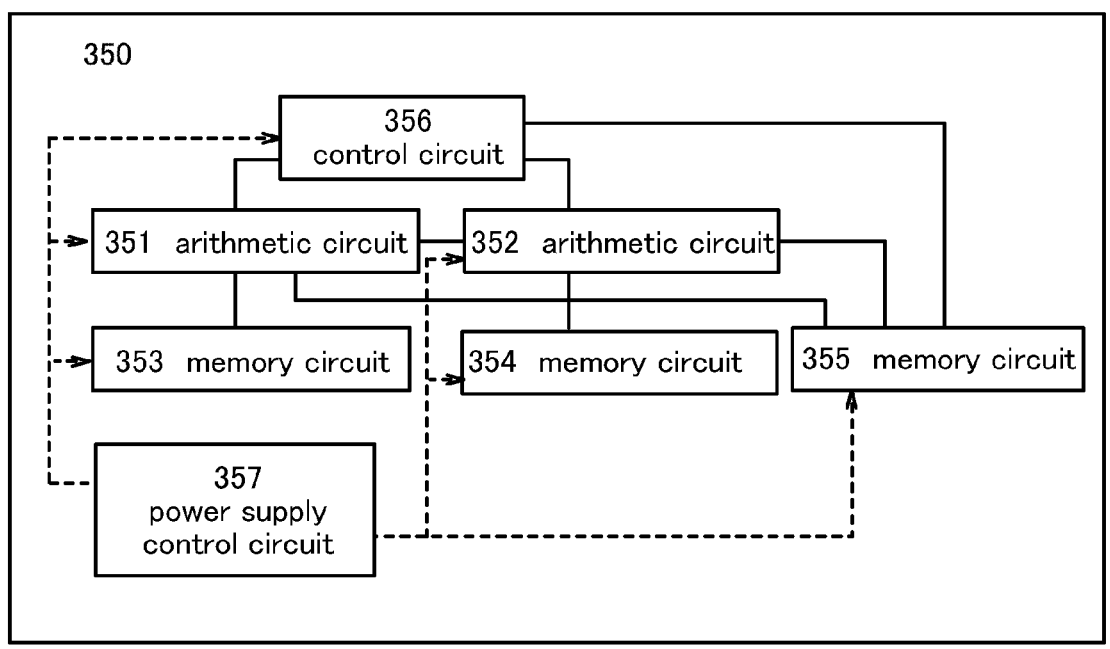
FIG. 13 illustrates a memory processing unit including a semiconductor device.

A memory processing unit 350 illustrated in FIG. 13 includes, at least, one or a plurality of arithmetic circuits and one or a plurality of memory circuits. Specifically, the memory processing unit 350 illustrated in FIG. 13 includes an arithmetic circuit 351, an arithmetic circuit 352, a memory circuit 353, a memory circuit 354, a memory circuit 355, a control circuit 356, and a power supply control circuit 357.

The arithmetic circuits 351 and 352 each include, as well as a logic circuit which carries out simple logic arithmetic processing, an adder, a multiplier, various arithmetic circuits, and the like. The memory circuit 353 functions as a register for temporarily holding data when the arithmetic processing is carried out in the arithmetic circuit 351. The memory circuit 354 functions as a register for temporarily holding data when the arithmetic processing is carried out in the arithmetic circuit 352.

In addition, the memory circuit 355 can be used as a main memory and can store a program executed by the control circuit 356 as data or can store data from the arithmetic circuit 351 and the arithmetic circuit 352.

The control circuit 356 is a circuit which performs centralized control of operations of the arithmetic circuit 351, the arithmetic circuit 352, the memory circuit 353, the memory circuit 354, and the memory circuit 355 which are included in the memory processing unit 350.

When the semiconductor device described in Embodiment 2 and the circuit configuration described in Embodiment 3 are used for the memory circuit 353, the memory circuit 354, and the memory circuit 355, data can be held even when the supply of power source voltage to the memory circuit 353, the memory circuit 354, and the memory circuit 355 is stopped. In the above manner, the application of the source voltage to the entire memory processing unit 350 can be stopped, whereby power consumption can be suppressed. Alternatively, the application of the source voltage to one or more of the memory circuit 353, the memory circuit 354, and the memory circuit 355 can be stopped, whereby power consumed by the memory processing unit 350 can be reduced. In addition, before the application of the source voltage is stopped, data can be written at high speed, and after the application of the source voltage is resumed, the memory processing unit 350 can return to the state which is the same as that before the application of the source voltage is stopped, in a short time.

In addition, when the application of the source voltage to the memory circuit 353, the memory circuit 354, and the memory circuit 355 is stopped, the application of the source voltage to the control circuit 356 or the arithmetic circuit 351 or 352 which transmits/receives data to/from the memory circuit 353, the memory circuit 354, and the memory circuit 355 may also be stopped. For example, when the arithmetic circuit 351 and the memory circuit 353 are not operated, the application of the source voltage to the arithmetic circuit 351 and the memory circuit 353 may be stopped.

In addition, the power supply control circuit 357 controls the level of the source voltage which is supplied to the arithmetic circuit 351, the arithmetic circuit 352, the memory circuit 353, the memory circuit 354, the memory circuit 355, and the control circuit 356 which are included in the memory processing unit 350. Further, in the case where the application of the source voltage is stopped, a switching element for stopping the application of the source voltage may be provided for the power supply control circuit 357, or for each of the arithmetic circuit 351, the arithmetic circuit 352, the memory circuit 353, the memory circuit 354, the memory circuit 355, and the control circuit 356.

Note that a memory circuit which functions as a cache memory may be provided between the memory circuit 355 that is a main memory and each of the arithmetic circuit 351, the arithmetic circuit 352, and the control circuit 356. Provision of the cache memory allows reduction of access to a low-speed main memory, so that the speed of the signal processing such as arithmetic processing can be increased. In addition, before the application of the source voltage is stopped, data can be written at high speed, and after the application of the source voltage is resumed, the memory processing unit 350 can return to the state which is the same as that before the source voltage is stopped, in a short time.

The semiconductor device of one embodiment of the present invention can be applied to the memory processing unit illustrated in FIG. 13.

This embodiment can be implemented in appropriate combination with any of the other embodiments.

(Embodiment 5)

In this embodiment, a configuration of a CPU that is one of memory circuits, in which a semiconductor device of one embodiment of the present invention is applied to a memory circuit, will be described.

Figure 14:
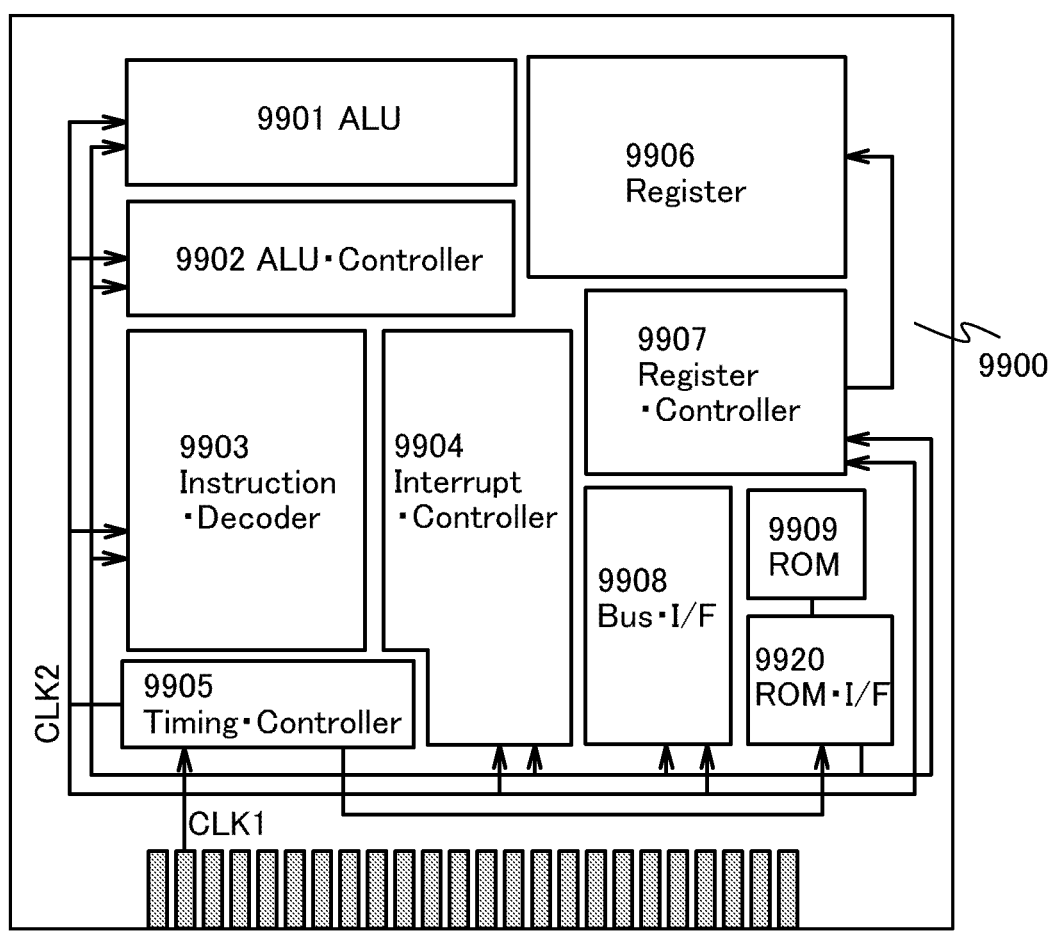
FIG. 14 illustrates a CPU including a semiconductor device.

FIG. 14 illustrates the configuration of the CPU according to this embodiment. The CPU illustrated in FIG. 14 mainly includes an ALU 9901, an ALU controller 9902, an instruction decoder 9903, an interrupt controller 9904, a timing controller 9905, a register 9906, a register controller 9907, a bus I/F 9908, a rewritable ROM 9909, and a ROM I/F 9920, over a substrate 9900.

Note that "ALU" means "arithmetic logic unit", "bus I/F" means "bus interface", and "ROM I/F" means "ROM interface". The ROM 9909 and the ROM I/F 9920 may be provided over another chip. It is needless to say that the CPU in FIG. 14 is only an example in which the configuration is simplified, and actual CPUs have various configurations depending on the application.

An instruction input to the CPU through the Bus I/F 9908 is input to the instruction decoder 9903 and decoded therein, and then, is input to the ALU controller 9902, the interrupt controller 9904, the register controller 9907, and the timing controller 9905.

The ALU controller 9902, the interrupt controller 9904, the register controller 9907, and the timing controller 9905 perform various controls based on the decoded instruction. Specifically, the ALU controller 9902 generates signals for controlling the drive of the ALU 9901. While the CPU is executing a program, the interrupt controller 9904 processes an interrupt request from an external input/output device or a peripheral circuit depending on its priority or a mask state. The register controller 9907 generates an address of the register 9906, and reads/writes data from/to the register 9906 depending on the state of the CPU.

The timing controller 9905 generates signals for controlling operation timings of the ALU 9901, the ALU controller 9902, the instruction decoder 9903, the interrupt controller 9904, and the register controller 9907. For example, the timing controller 9905 is provided with an internal clock generator for generating an internal clock signal CLK2 on the basis of a reference clock signal CLK1, and inputs the internal clock signal CLK2 to the above circuits.

In the CPU of this embodiment, a memory circuit having the semiconductor device described in Embodiment 2 and the circuit configuration described in Embodiment 3 is provided in the register 9906. The register controller 9907 can temporarily hold data in the memory circuit in the register 9906, in response to an instruction from the ALU 9901.

In such a manner, even in the case where the operation of the CPU is temporarily stopped and the application of the source voltage is stopped, data can be held and power consumption can be reduced. Specifically, for example, while a user of a personal computer does not input data to an input device such as a keyboard, the operation of a CPU can be stopped, so that the power consumption can be reduced.

Although the CPU is described as an example in this embodiment, the semiconductor device according to one embodiment of the present invention is not limited to the CPU and can be applied to an LSI such as a microprocessor, an image processing circuit, a digital signal processor (DSP), or a field programmable gate array (FPGA).

This embodiment can be implemented in appropriate combination with any of the other embodiments.

(Embodiment 6)

In this embodiment, description will be given of an electronic device including the semiconductor device according to one embodiment of the present invention so that power consumption is low.

The semiconductor device according to one embodiment of the present invention can be used for a display device, a personal computer, or an image reproducing device provided with recording media (typically, a device which reproduces the content of recording media such as a digital versatile disc (DVD) and has a display for displaying the reproduced image). Other examples of electronic devices each of which can be provided with the semiconductor device, according to one embodiment of the present invention, include a mobile phones, game machines including portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATMs), vending machines, and the like.

Description will be given of the cases in which the semiconductor device according to one embodiment of the present invention is applied to portable electronic devices such as a mobile phone, a smartphone, and an e-book reader, with reference to FIG. 15 and FIG. 16.

Figure 15:
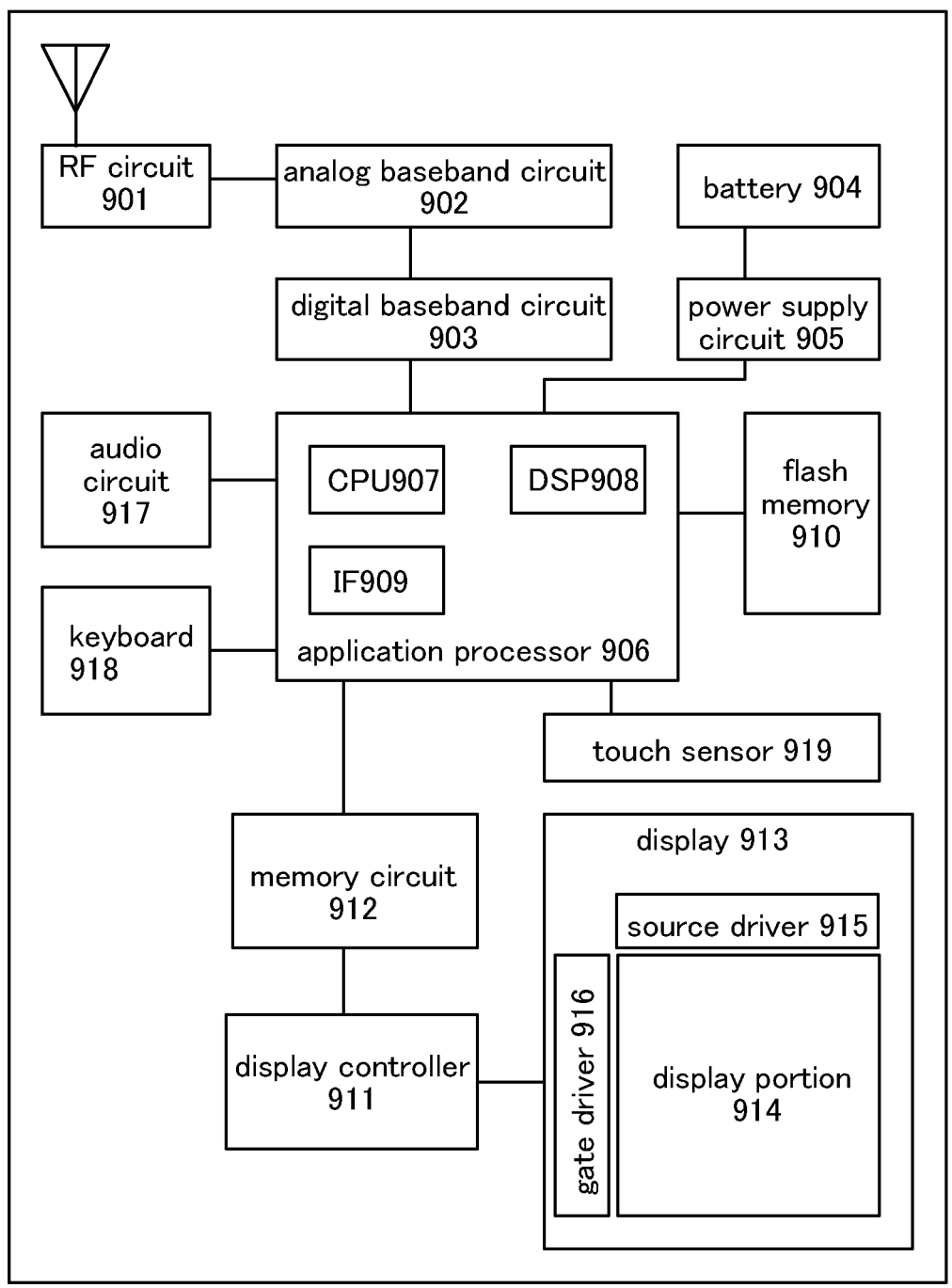
FIG. 15 illustrates an electronic device.

FIG. 15 is a block diagram of a portable electronic device. The portable electronic device illustrated in FIG. 15 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. The use of the semiconductor device described in the above embodiment for, for example, the CPU 907 allows reduction in power consumption.

Figure 16:
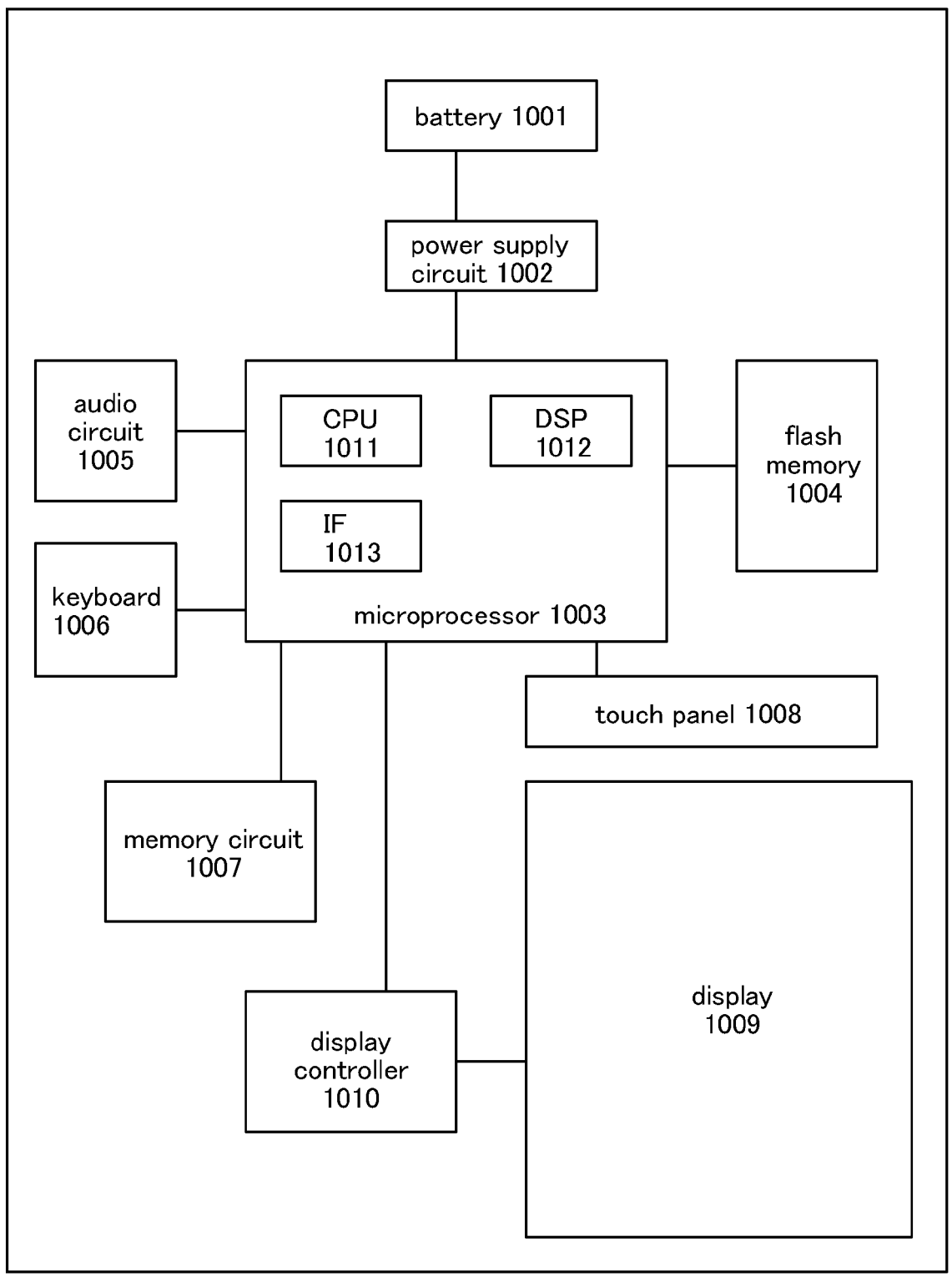
FIG. 16 illustrates an electronic device.

FIG. 16 is a block diagram of an e-book reader. The electronic book reader includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010. The microprocessor 1003 includes a CPU 1011, a DSP 1012, and an interface 1013. Further, the use of the semiconductor device described in the above embodiment for, for example, the CPU 1011 allows reduction in power consumption.

This embodiment can be implemented in appropriate combination with any of the other embodiments.

This application is based on Japanese Patent Application serial no. 2012-073827 filed with Japan Patent Office on Mar. 28, 2012, the entire contents of which are hereby incorporated by reference.

What is claimed is:

1. A semiconductor device comprising:
   an oxide insulating film;
   a transistor comprising an oxide semiconductor film, a source electrode and a drain electrode in contact with the oxide semiconductor film, a gate insulating film over the oxide semiconductor film and a gate electrode over the gate insulating film; and
   a first oxygen barrier film penetrating the oxide insulating film, wherein the oxide semiconductor film is over and in contact with the oxide insulating film, wherein the oxide semiconductor film comprises a channel formation region, wherein the first oxygen barrier film surrounds a region of the oxide insulating film, and wherein the channel formation region overlaps with the region of the oxide insulating film.

2. The semiconductor device according to claim 1, further comprising a transistor including silicon, wherein the oxide insulating film is over the transistor including silicon.

3. The semiconductor device according to claim 1, further comprising a second oxygen barrier film, wherein the oxide insulating film is over and in contact with the second oxygen barrier film, and wherein the second oxygen barrier film comprises at least one of a metal selected from aluminum, ruthenium, iridium, hafnium, and tantalum; a metal oxide thereof; or a metal nitride thereof.

4. The semiconductor device according to claim 1, wherein the first oxygen barrier film comprises at least one of a metal selected from aluminum, ruthenium, iridium, hafnium, and tantalum; a metal oxide thereof; or a metal nitride thereof.

5. The semiconductor device according to claim 1, wherein the oxide semiconductor film includes at least indium or zinc.

6. An electronic device comprising the semiconductor device according to claim 1.

7. A semiconductor device comprising:
an oxide insulating film;
a transistor comprising an oxide semiconductor film, a source electrode and a drain electrode in contact with the oxide semiconductor film, a gate insulating film over the oxide semiconductor film, and a gate electrode over the gate insulating film; and
a pair of first oxygen barrier films penetrating the oxide insulating film, wherein one of the pair of first oxygen barrier films is in contact with the source electrode and the other of the pair of first oxygen barrier films is in contact with the drain electrode, wherein the oxide semiconductor film is over and in contact with the oxide insulating film, wherein the oxide semiconductor film comprises a channel formation region, wherein a region of the oxide insulating film is sandwiched between the pair of first oxygen barrier films, and wherein the channel formation region overlaps with the region of the oxide insulating film.

8. The semiconductor device according to claim 7, further comprising a transistor including silicon, wherein the oxide insulating film is over the transistor including silicon, wherein the pair of first oxygen barrier films comprises a conductive material, and wherein one of the pair of first oxygen barrier films is in contact with the gate electrode of the transistor including silicon.

9. The semiconductor device according to claim 7, further comprising a second oxygen barrier film, wherein the oxide insulating film is over and in contact with the second oxygen barrier film, and wherein the second oxygen barrier film comprises at least one of a metal selected from aluminum, ruthenium, iridium, hafnium, and tantalum; a metal oxide thereof; or a metal nitride thereof.

10. The semiconductor device according to claim 7, wherein the pair of first oxygen barrier films comprises at least one of a metal selected from aluminum, ruthenium, iridium, hafnium, and tantalum; a metal oxide thereof; or a metal nitride thereof.

11. The semiconductor device according to claim 7, wherein the oxide semiconductor film includes at least indium or zinc.

12. An electronic device comprising the semiconductor device according to claim 7.

13. A semiconductor device comprising:
a first transistor comprising a first channel formation region, a first gate insulating layer over the first channel formation region and a first gate electrode over the first gate insulating layer;
an insulating film over the first transistor;
an oxide insulating film over the insulating film;
a second transistor comprising an oxide semiconductor film, a gate insulating film over the oxide semiconductor film, a source electrode and a drain electrode in contact with the oxide semiconductor film, and a gate electrode over the gate insulating film;
a first oxygen barrier film penetrating the oxide insulating film; and
a second oxygen barrier film penetrating the oxide insulating film;

wherein the oxide semiconductor film is over and in contact with the oxide insulating film, wherein the first oxygen barrier film is in contact with the source electrode and the second oxygen barrier film is in contact with the drain electrode, wherein the first gate electrode is electrically connected to the source electrode of the second transistor, wherein a region of the oxide insulating film is sandwiched between the first oxygen barrier film and the second oxygen barrier film, and wherein a second channel formation region in the oxide semiconductor film of the second transistor overlaps with the region of the oxide insulating film.

14. The semiconductor device according to claim 13, further comprising a third oxygen barrier film between the insulating film and the oxide insulating film, and wherein the third oxygen barrier film comprises at least one of a metal selected from aluminum, ruthenium, iridium, hafnium, and tantalum; a metal oxide thereof; or a metal nitride thereof.

15. The semiconductor device according to claim 13, wherein the first channel formation region is formed in a semiconductor material including silicon.

16. The semiconductor device according to claim 13, wherein each of the first oxygen barrier film and the second oxygen barrier film comprises at least one of a metal selected from aluminum, ruthenium, iridium, hafnium, and tantalum; a metal oxide thereof; or a metal nitride thereof.

17. The semiconductor device according to claim 13, wherein the oxide semiconductor film includes at least indium or zinc.

18. An electronic device comprising the semiconductor device according to claim 13.

19. The semiconductor device according to claim 7, further comprising a second oxygen barrier film sandwiched between the oxide insulating film and one of the source electrode and the drain electrode.

20. The semiconductor device according to claim 13,
wherein the first oxygen barrier film is provided in an opening of the oxide insulating film, and wherein the first oxygen barrier film is between an inner wall of the opening of the oxide insulating film and the source electrode.

* * * * *